US011728410B2

(12) United States Patent
Kim et al.

(10) Patent No.: US 11,728,410 B2
(45) Date of Patent: Aug. 15, 2023

(54) SEMICONDUCTOR DEVICE

(71) Applicant: Samsung Electronics Co., Ltd., Suwon-si (KR)

(72) Inventors: Jin A. Kim, Hwaseong-si (KR); Ho-In Ryu, Suwon-si (KR); Jae Won Na, Hwaseong-si (KR)

(73) Assignee: Samsung Electronics Co., Ltd., Gyeonoggi-do (KR)

( * ) Notice: Subject to any disclaimer, the term of this patent is extended or adjusted under 35 U.S.C. 154(b) by 42 days.

(21) Appl. No.: 17/339,144

(22) Filed: Jun. 4, 2021

(65) Prior Publication Data

US 2022/0102528 A1    Mar. 31, 2022

(30) Foreign Application Priority Data

Sep. 29, 2020 (KR) .......................... 10-2020-0126904

(51) Int. Cl.
 *H01L 29/66* (2006.01)
 *H01L 29/06* (2006.01)
 *H01L 29/423* (2006.01)

(52) U.S. Cl.
 CPC ...... *H01L 29/6656* (2013.01); *H01L 29/0642* (2013.01); *H01L 29/4236* (2013.01)

(58) Field of Classification Search
 CPC ............. H01L 29/6656; H01L 29/4236; H01L 29/0642
 See application file for complete search history.

(56) References Cited

U.S. PATENT DOCUMENTS

2018/0102364 A1* 4/2018 Rastogi ................. H01L 27/092
2018/0122898 A1* 5/2018 Park ..................... H01L 21/7682

FOREIGN PATENT DOCUMENTS

| KR | 10-0363710 B1 | 12/2002 |
|----|---------------|---------|
| KR | 10-2014-0086645 A | 7/2014 |
| KR | 10-2015-0053020 A | 5/2015 |
| KR | 10-2016-0068067 A | 6/2016 |
| KR | 10-2016-0089095 A | 7/2016 |
| KR | 10-1851727 B1 | 6/2018 |
| KR | 10-2018-0129122 A | 12/2018 |
| KR | 10-2018-0131915 A | 12/2018 |
| KR | 10-2019-0083227 A | 7/2019 |
| KR | 10-2001417 B1 | 7/2019 |

* cited by examiner

*Primary Examiner* — Fernando L Toledo
*Assistant Examiner* — Valerie N Newton
(74) *Attorney, Agent, or Firm* — Harness, Dickey & Pierce, P.L.C.

(57) ABSTRACT

A semiconductor device includes a substrate having a trench, a conductive pattern in the trench, a spacer structure on a side surface of the conductive pattern, and a buried contact including a first portion apart from the conductive pattern by the spacer structure and filling a contact recess, and a second portion on the first portion having a pillar shape with a width smaller than that of a top surface of the first portion. The spacer structure includes a first spacer extending along the second portion of the buried contact on the first portion of the buried contact and contacting the buried contact, a second spacer extending along the first spacer, and a third spacer extending along the side surface of the conductive pattern and the trench and apart from the first spacer by the second spacer, the first spacer includes silicon oxide, and the second spacer includes silicon nitride.

20 Claims, 30 Drawing Sheets

SEMICONDUCTOR DEVICE

CROSS-REFERENCE TO RELATED APPLICATION

This application claims priority from Korean Patent Application No. 10-2020-0126904 filed on Sep. 29, 2020 in the Korean Intellectual Property Office, and all the benefits accruing therefrom under 35 U.S.C. § 119, the contents of which in its entirety are herein incorporated by reference.

BACKGROUND

Some example embodiments relate to a semiconductor device and/or a method of fabricating a semiconductor device.

As a semiconductor device becomes more highly integrated, individual circuit patterns have become more miniaturized to realize more semiconductor devices within the same area.

Nonetheless, as the semiconductor memory device becomes more highly integrated, the effects of a parasitic capacitance and/or a leakage current increase more and more. Since the parasitic capacitance and/or the leakage current deteriorate the operating characteristics of the semiconductor device, a semiconductor device capable of minimizing or reducing the parasitic capacitance and/or the leakage current is desired.

SUMMARY

Some example embodiments provide a semiconductor device having improved operating characteristics.

Alternatively or additionally, some example embodiments also provide a method of fabricating a semiconductor package capable of fabricating a semiconductor device and/or semiconductor package with improved product reliability.

According to some example embodiments of inventive concepts, a semiconductor device includes a substrate having a trench and a contact recess, a conductive pattern in the trench and having a width less than a width of the trench, a spacer structure on a side surface of the conductive pattern, and a buried contact including a first portion spaced apart from the conductive pattern by the spacer structure and filling the contact recess, and a second portion on the first portion, the second portion having a pillar shape having a width less than a width of a top surface of the first portion. The contact recess has a curved profile, the spacer structure includes a first spacer at an outermost side, the first spacer on the first portion of the buried contact, extending along the second portion of the buried contact, and contacting buried contact, a second spacer extending on the first spacer along the first spacer, and a third spacer extending along the side surface of the conductive pattern and the trench and spaced apart from the first spacer by the second spacer, and the first spacer includes silicon oxide, and the second spacer includes silicon nitride.

According to some example embodiments of inventive concepts, a semiconductor device includes a substrate including an element isolation layer and an active region defined by the element isolation layer and arranged in a first direction, a plurality of buried contacts connected to the active region and arranged in a second direction different from the first direction, a plurality of bit line structures between the plurality of buried contacts that are adjacent to each other, the plurality of bit line structures extending across the active region in a third direction crossing the second direction, and a spacer structure extending in the third direction along side surfaces of the plurality of bit line structures. Each of the plurality of bit line structures includes a first bit line structure overlapping the active region and a second bit line structure overlapping the element isolation layer, each of the buried contacts includes a first portion recessed into the element isolation layer and the active region between the first bit line structure and the second bit line structure, and a second portion on the first portion, the second portion having a pillar shape with a width less than that of a top surface of the first portion, a width of the first portion decreases away from a top surface of the substrate, and the spacer structure includes a first spacer including silicon oxide and disposed at an outermost side, the first spacer extending along a side surface of the second portion, and a second spacer including silicon nitride and extending along the first spacer on the first spacer.

According to some example embodiments of inventive concepts, a semiconductor device includes a substrate having a gate trench, a gate electrode filling a part of the gate trench and extending in a first direction, a source/drain region on a side surface of the gate electrode, a plurality of buried contacts including a buried contact electrically connected to the source/drain region, the plurality of buried contacts being arranged in the first direction, a landing pad on the buried contact, a capacitor structure on the landing pad and electrically connected to the landing pad and the buried contact, a bit line structure extending in a second direction crossing the first direction between the plurality of buried contacts spaced apart in the first direction, the bit line structure including a conductive pattern and a capping pattern on the conductive pattern, and a spacer structure on a side surface of the bit line structure and extending in the second direction. In cross-sectional view taken along the first direction, the buried contact includes a first portion recessed into the substrate and having an elliptical hemispherical shape convex toward the substrate, and a second portion having a pillar shape having a width smaller than a width of a top surface of the first portion, the buried contact spaced apart from the bit line structure by the spacer structure, the spacer structure includes a first spacer in contact with the second portion of the buried contact, a second spacer extending along a side surface of the first spacer on the first spacer, and a third spacer extending along a side surface of the second spacer on the second spacer, a boundary between the first portion of the buried contact and the second portion of the buried contact is positioned on a bottom surface of the first spacer, the first spacer includes silicon oxide, the second spacer includes silicon nitride, and the third spacer includes at least one of air or silicon oxide.

However, example embodiments of inventive concepts are not restricted to those set forth herein. The above and other aspects of example embodiments will become more apparent to one of ordinary skill in the art to which inventive concepts pertains by referencing the detailed description of inventive concepts given below.

BRIEF DESCRIPTION OF THE DRAWINGS

The above and other aspects and features of example embodiments will become more apparent by describing in detail some example embodiments thereof with reference to the attached drawings, in which.

DETAILED DESCRIPTION OF SOME EXAMPLE EMBODIMENTS

Figure 1:
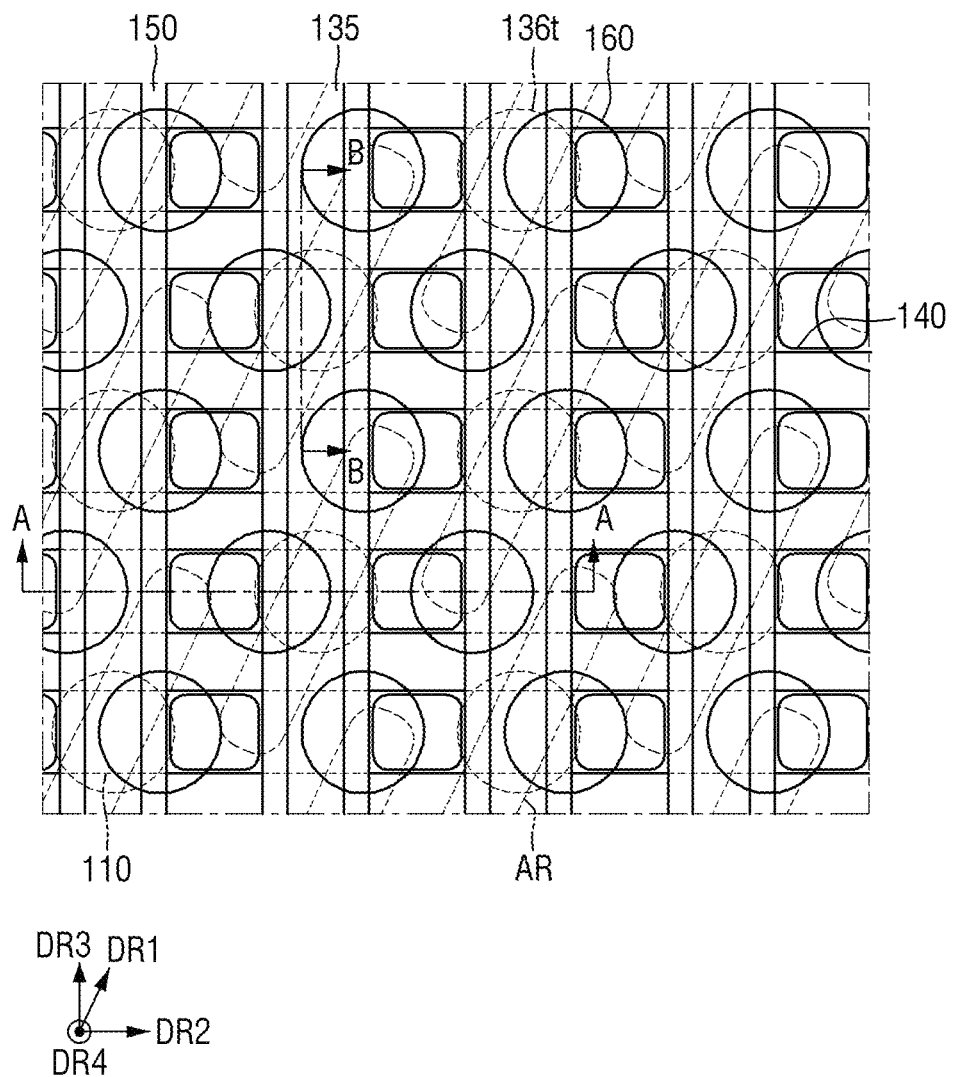
FIG. 1 is a layout diagram illustrating a semiconductor device according to some example embodiments.
Figure 2:
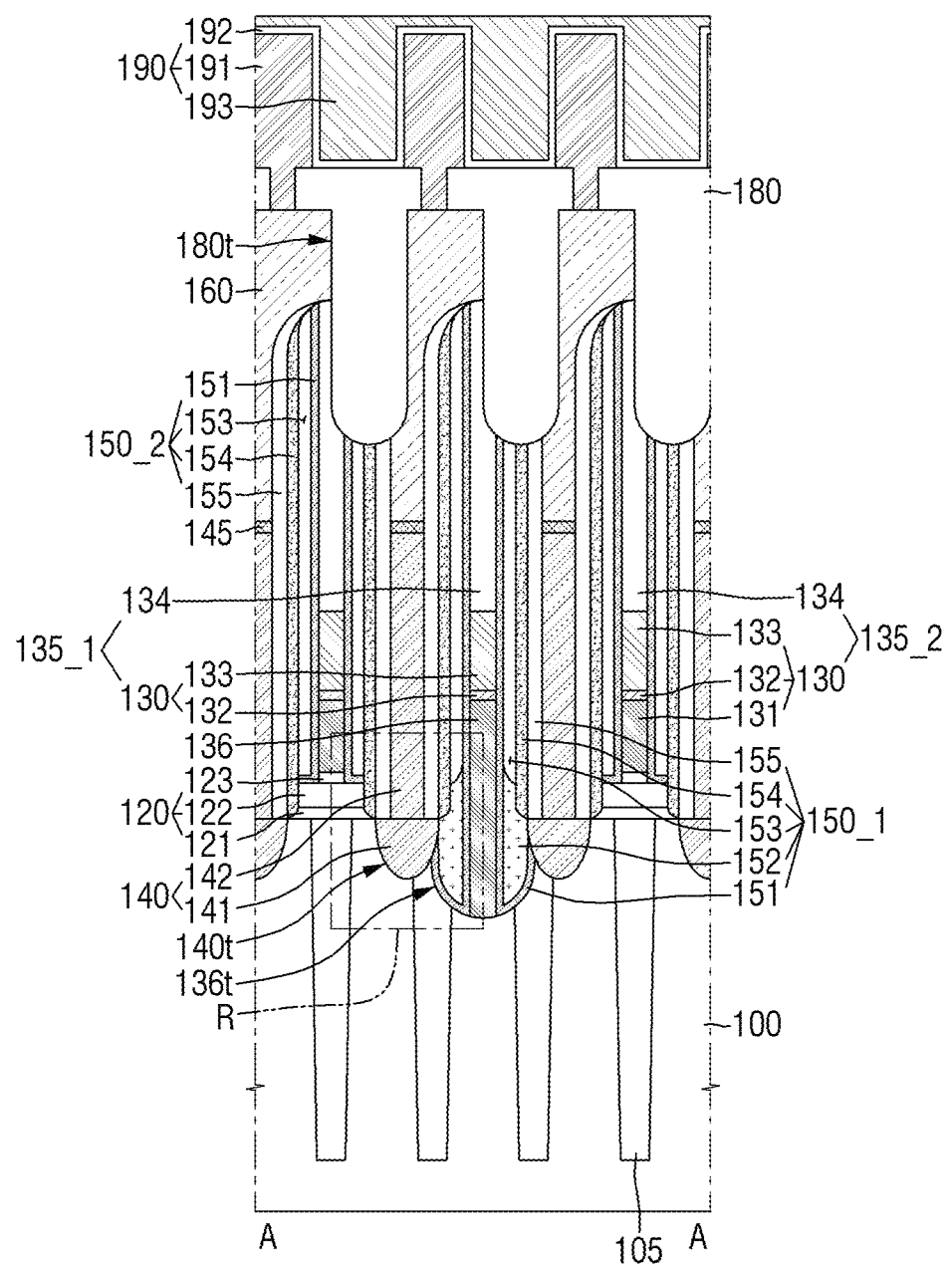
FIG. 2 is a cross-sectional view taken along line A-A of FIG. 1.
Figure 3:
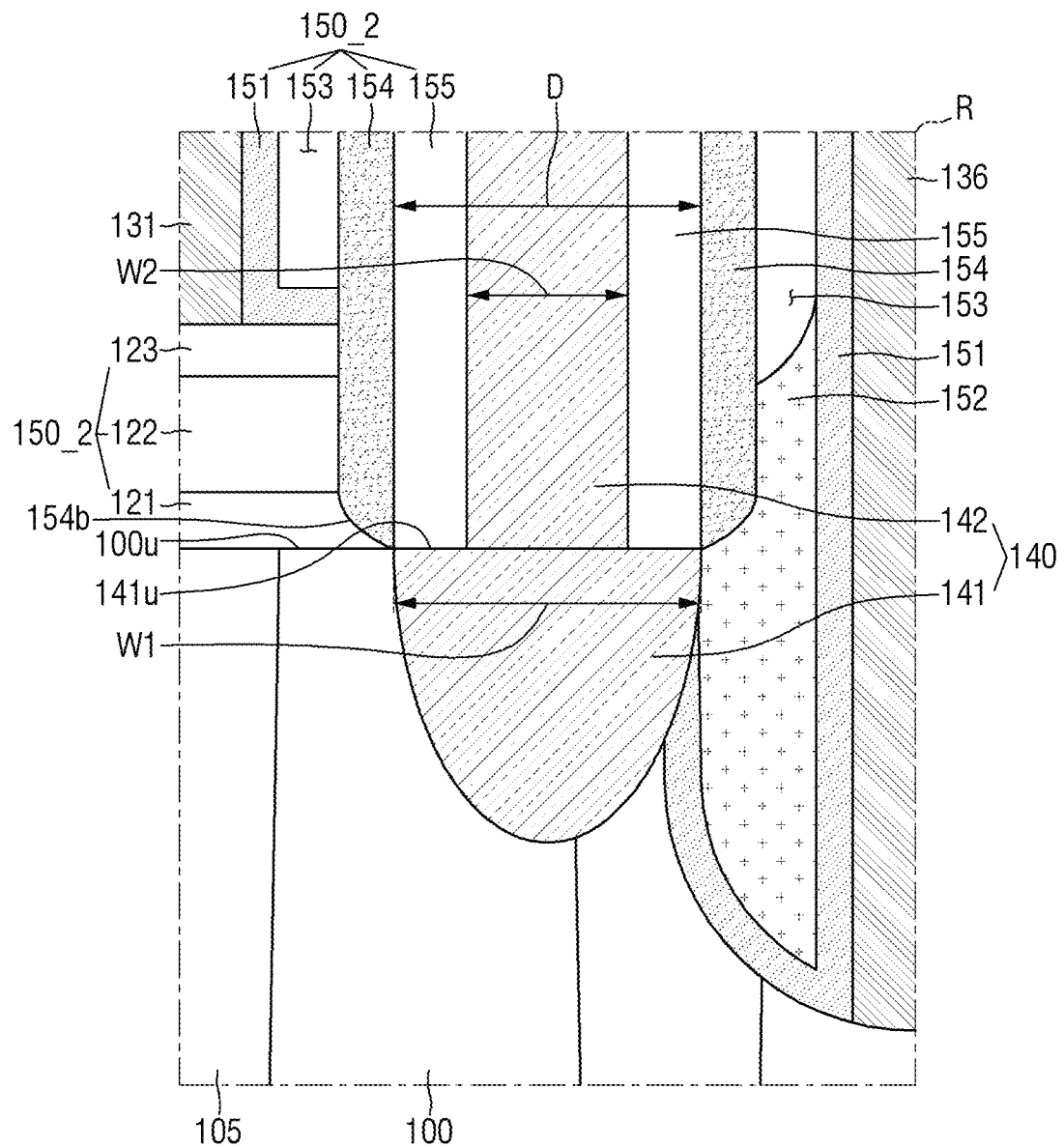
FIG. 3 is an enlarged view of area R of FIG. 2.
Figure 4:
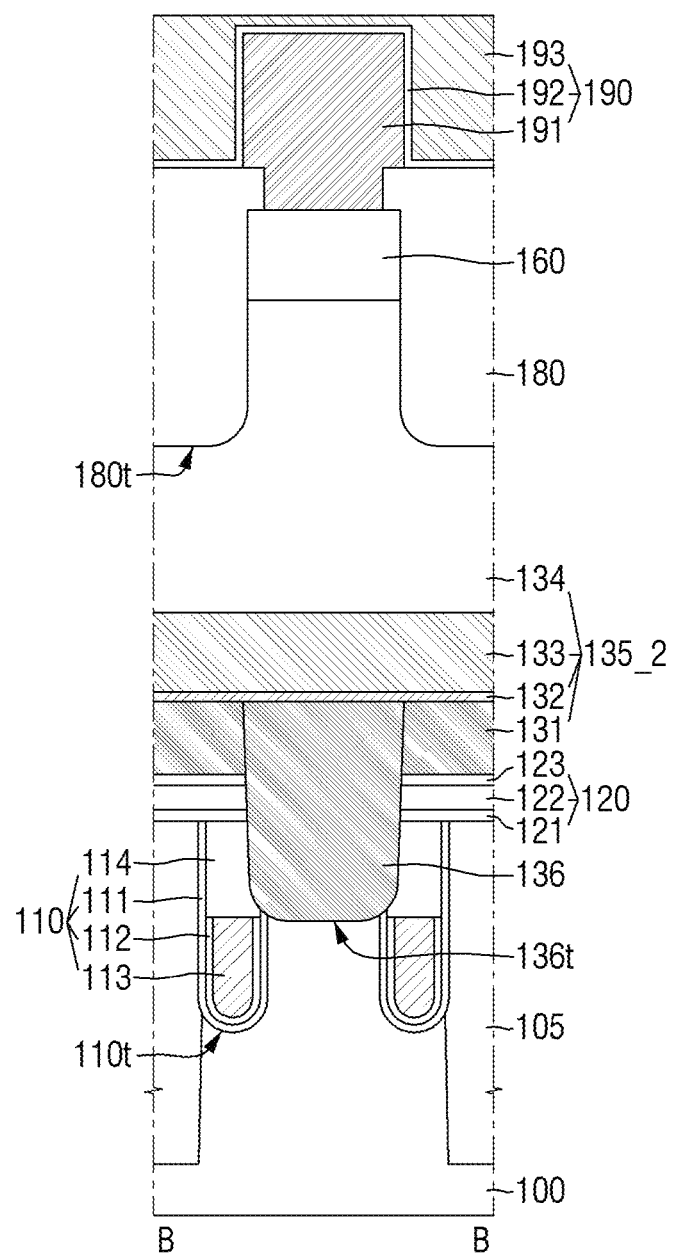
FIG. 4 is a cross-sectional view taken along line B-B of FIG. 1.

FIG. 1 is a layout diagram illustrating a semiconductor device according to some example embodiments. FIG. 2 is a cross-sectional view taken along line A-A of FIG. 1. FIG. 3 is an enlarged view of area R of FIG. 2. FIG. 4 is a cross-sectional view taken along line B-B of FIG. 1.

Referring to FIGS. 1 to 4, a semiconductor device according to some example embodiments include a substrate 100, an element isolation layer 105, a word line structure 110, an insulating pattern 120, bit line structures 135_1 and 135_2, a direct contact 136, spacer structures 150_1 and 150_2, a buried contact 140, an interlayer insulating layer 180, and a capacitor structure 190. The direct contact 136 may be also referred to as a bit line contact.

The substrate 100 may have a structure in which a base substrate and an epitaxial layer such as a homogeneous or heterogeneous epitaxial layer are stacked, but example embodiments are not limited thereto. The substrate 100 may be or may include a silicon substrate, a gallium arsenide substrate, a silicon germanium substrate, or a silicon-on-insulator (SOI) substrate. For convenience, the description below assumes that the substrate 100 is a silicon substrate.

The substrate 100 may include active regions AR. As the design rule of the semiconductor device decreases, the active region AR may be formed in a diagonal bar shape. For example, as illustrated in FIG. 1, the active region AR may have a bar shape extending in a first direction DR1. The active regions AR may be arranged in the first direction DR1. Among the active regions AR, one active region AR may be arranged such that the center of the active region AR is located close to an end of another active region AR.

The active region AR may include impurities, such as at least one of boron, phosphorus, or arsenic impurities, so that the active region AR functions as a source/drain region, e.g. a source/drain region of a transistor. In some example embodiments, the center of the active region AR may be electrically connected to the first bit line structure 135_1 by the bit line contact/direct contact 136, and both ends of the active region AR may be electrically connected to the capacitor structure 190 by contact structures 140, 145, and 160. The contact structures 140, 145, and 160 may include a buried contact 140, a silicide layer 145, and a landing pad 160 that are sequentially stacked.

The element isolation layer 105 may define the active regions AR. Although the drawings illustrate that the side surface of the element isolation layer 105 is inclined, this is only the characteristics of the process and example embodiments are not limited thereto.

The element isolation layer 105 may include, e.g. may consist of, silicon oxide, silicon nitride or a combination thereof, but is not limited thereto. The element isolation layer 105 may be a single layer made of one kind of insulating material or a multilayer made of a combination of several kinds of insulating materials. The element isolation layer 105 may be or may include a shallow trench isolation (STI); however, example embodiments are not limited thereto.

The word line structure 110 may be elongated along a second direction DR2 across the active region AR and the bit line structure 135. For example, the word line structure 110 may diagonally cross the active region AR and vertically cross the bit line structure 135. A plurality of word line structures 110 may extend in parallel with each other. The plurality of word line structures 110 may be spaced apart from each other at equal intervals. The second direction DR2 may be at an angle with the first direction DR1, e.g. at an angle of about 70 degrees with the first direction DR1; however, example embodiments are not limited thereto.

In some example embodiments, the word line structure 110 may be buried in/within the substrate 100. For example, the substrate 100 may include a gate trench 110t extending in the second direction DR2. The word line structure 110 may include a gate dielectric layer 111, a first gate electrode 112, a second gate electrode 113, and a gate capping pattern 114.

The gate dielectric layer 111 may extend along the sidewall and the bottom surface of the gate trench 110t. The gate dielectric layer 111 may extend along at least a part of the profile of the gate trench 110t. The gate dielectric layer 111 may include or may consist of, for example, at least one of silicon oxide, silicon oxynitride, silicon nitride, or a high dielectric constant (high-k) material having a dielectric constant greater than that of the silicon oxide, without being limited thereto.

The first gate electrode 112 and the second gate electrode 113 may be sequentially formed on the gate dielectric layer 111. The first gate electrode 112 and the second gate electrode 113 may fill at least a part of the gate trench 110t.

Although the drawings illustrate that the word line structure 110 is a multilayer including the two gate electrodes 112 and 113, example embodiments are not limited to thereto and the word line structure 110 may be a single layer including one gate electrode. The first gate electrode 112 and the second gate electrode 113 may each be or include, for example, metal, doped or undoped polysilicon, or a combination thereof, but are not limited thereto.

The gate capping pattern 114 may be formed on the second gate electrode 113. The gate capping pattern 114 may fill the remaining gate trench 110t after the formation of the first gate electrode 112 and the second gate electrode 113. Although the drawings illustrate that the gate dielectric layer 111 extends along the sidewall of the gate capping pattern 114, the present disclosure is not limited thereto.

The gate capping pattern 114 may include or consist of, for example, at least one of silicon nitride (SiN), silicon oxynitride (SiON), silicon oxide ($SiO_2$), silicon carbonitride (SiCN), silicon oxycarbonitride (SiOCN), or a combination thereof.

The insulating pattern 120 may be formed on the substrate 100 and the element isolation layer 105. In some example embodiments, the insulating pattern 120 may extend along the top surface of the substrate 100 and the top surface of the element isolation layer 105 in a region where the direct contact 136 and the buried contact 140 are not formed.

The insulating pattern 120 may be or include a single layer or a multilayer as shown in the drawing. For example, the insulating pattern 120 may include a first insulating layer 121, a second insulating layer 122, and a third insulating layer 123 sequentially stacked on the substrate 100.

The first insulating layer 121 may include or consist of, for example, silicon oxide. The second insulating layer 122 may include a material have an etch selectivity different from that of the first insulating layer 121. For example, the second insulating layer 122 may include silicon nitride. The third insulating layer 123 may include or consist of a material having a dielectric constant less than that of the second insulating layer 122. For example, the third insulating layer 123 may include silicon oxide.

In some example embodiments, the width of the third insulating layer 123 may be substantially the same as the width of the bit line structures 135_1 and 135_2.

The bit line structures 135_1 and 135_2 may be formed on the substrate 100 and the element isolation layer 105. The bit line structures 135_1 and 135_2 may be elongated along a third direction DR3 across the active region AR and the word line structure 110. For example, the bit line structures 135_1 and 135_2 may diagonally cross the active region AR and vertically cross the word line structure 110. The multiple bit line structures 135_1 and 135_2 may extend in parallel with each other. The multiple bit line structures 135_1 and 135_2 may be spaced apart from each other at equal intervals. The third direction DR3 may be perpendicular to the second direction DR2; however, example embodiments are not limited thereto.

The bit line structures 135_1 and 135_2 may include the first bit line structure 135_1 overlapping the substrate 100, and the second bit line structure 135_2 overlapping the element isolation layer 105. The first bit line structure 135_1 may be formed on, e.g. directly on, the direct contact 136. The second bit line structure 135_2 may be formed on, e.g. directly on, the insulating pattern 120.

The bit line structures 135_1 and 135_2 may include a conductive pattern 130 and a capping pattern 134 sequentially disposed on the substrate 100.

The conductive pattern 130 may be or may include a single layer or a multilayer as shown in the drawing. For example, the conductive pattern 130 may include a first conductive layer 131, a second conductive layer 132, and a third conductive layer 133 sequentially stacked on the substrate 100.

The first conductive layer 131, the second conductive layer 132, and the third conductive layer 133 may each include, for example, doped or undoped polysilicon, TiN, TiSiN, tungsten, tungsten silicide, or a combination thereof, but is not limited thereto. For example, the first conductive layer 131 may include doped or undoped polysilicon, the second conductive layer 132 may include TiSiN, and the third conductive layer 133 may include tungsten.

The capping pattern 134 may be formed on, e.g. directly on, the conductive pattern 130. For example, the capping pattern 134 may be formed on the third conductive layer 133. The capping pattern 134 may include or consist of silicon nitride, but is not limited thereto.

The direct contact 136 may penetrate the insulating pattern 120 to connect the active region AR of the substrate 100 to the bit line structures 135_1 and 135_2. The direct contact 136 may penetrate the insulating pattern 120 in a fourth direction DR4. For example, the substrate 100 may include a first trench 136t formed in the active region AR and the element isolation layer 105. The first trench 136t may penetrate the insulating pattern 120 to expose at least a part of the active region AR. The direct contact 136 may be formed in the first trench 136t to connect the active region AR to the conductive pattern 130.

In some example embodiments, as shown in FIG. 1, the first trench 136t may expose the center of the active region AR. Accordingly, the direct contact 136 may overlap the center of the active region AR. Further, the first bit line structure 135_1 disposed on the direct contact 136 may overlap the center of the active region AR. In some example embodiments, a part of the first trench 136t may overlap a part of the element isolation layer 105. Accordingly, the first trench 136t may expose a part of the element isolation layer 105 as well as a part of the substrate 100.

The direct contact 136 may contain a conductive material such as at least one of tungsten, doped polysilicon, or aluminum. Accordingly, the conductive patterns 130 of the bit line structures 135_1 and 135_2 may be electrically connected to the active region AR of the substrate 100. The active region AR of the substrate 100 connected to the conductive patterns 130 and the direct contact 136 may function as a source/drain region.

In some example embodiments, the direct contact 136 may contain the same material as that of the first conductive layer 131. For example, the direct contact 136 may contain doped or undoped polysilicon. However, example embodiments are not limited thereto, and the direct contact 136 may contain a material different from that of the first conductive layer 131 depending on a manufacturing process.

In some example embodiments, the width of the direct contact 136 may be smaller than the width of the first trench 136t. For example, as shown in FIG. 2, the direct contact 136 may overlap only a part of the substrate 100 exposed by the first trench 136t. The direct contact 136 may be disposed at the center of the substrate 100 exposed by the first trench 136t.

In some example embodiments, the width of the bit line structures 135_1 and 135_2 may be smaller than the width of the first trench 136t. For example, the width of the bit line structures 135_1 and 135_2 may be substantially the same as the width of the direct contact 136.

The buried contact 140 may be formed on the substrate 100 between the multiple bit line structures 135_1 and 135_2. For example, as shown in FIG. 2, the buried contact 140 may be disposed in the region defined by the word line structure 110 and the bit line structures 135_1 and 135_2. The buried contacts 140 may form a plurality of isolated regions separated from each other. The buried contacts 140 may be arranged in the first direction DR1 and the second direction DR2.

The buried contact 140 may penetrate the insulating pattern 120 to connect the active region AR of the substrate 100 to the landing pad 160. For example, the substrate 100 may include a contact recess 140t in the active region AR. The contact recess 140t may penetrate the insulating pattern 120 to expose a part of the active region AR. The buried contact 140 may be formed in the contact recess 140t to connect the active region AR of the substrate 100 to the landing pad 160.

In some example embodiments, the contact recess 140t may expose both ends of the active region AR. Accordingly, as shown in FIG. 1, the buried contact 140 may be connected to both ends of the active region AR. A part of the contact recess 140t may overlap a part of the element isolation layer 105. Thus, the contact recess 140t may expose a part of the element isolation layer 105 as well as a part of the substrate 100.

The buried contact 140 may include a first portion 141 and a second portion 142.

The first portion 141 may fill at least a part of the contact recess 140t. The contact recess 140t may have a curved profile, e.g. a curved profile taken in a cross-section along direction DR2. The contact recess 140t may have, for example, a curved profile that is convex toward the substrate 100. For example, the width of the contact recess 140t in the second direction DR2 may decrease as the contact recess 140t moves away from a top surface 100u of the substrate 100. Accordingly, the first portion 141 may be a portion recessed into the element isolation layer 105 and the active region AR, between the first bit line structure 135_1 and the second bit line structure 135_2. The first portion 141 may have an elliptical hemispherical shape convex toward the substrate 100, or convex away from the substrate 100. In addition, the width of the first portion 141 in the second direction DR2 may decrease as the first portion 141 moves away from the top surface 100u of the substrate 100.

The second portion 142 may be disposed on, e.g. directly on, the first portion 141. A second width W2 of the second portion 142 in the second direction DR2 may be smaller than a first width W1 of the first portion 141. The second portion 142 may have a pillar shape or a cylindrical shape having the second width W2 in the second direction DR2.

In some example embodiments, a top surface 141u of the first portion 141 may be disposed on substantially the same plane as the top surface 100u of the substrate 100. For example, the boundary between the first portion 141 and the second portion 142 may be positioned on the top surface 100u of the substrate 100.

The buried contact 140 may include, e.g. may consist of, a conductive material. Accordingly, the buried contact 140 may be electrically connected to the active region AR of the substrate 100. The active region AR of the substrate 100 connected to the buried contact 140 may function as a source/drain region. The buried contact 140 may include, for example, doped or undoped polysilicon, but is not limited thereto. Accordingly, the boundary between the first portion 141 and the second portion 142 of the buried contact 140 may not be distinguished. For example, there may not be a boundary or an interface between the first portion 141 and the second portion 142 that is observable with a microscope such as a transmission electron microscope (TEM).

The spacer structures 150_1 and 150_2 may be disposed on the side surfaces of the bit line structures 135_1 and 135_2. The spacer structures 150_1 and 150_2 may extend along the side surfaces of the bit line structures 135_1 and 135_2. The spacer structures 150_1 and 150_2 may be elongated along the third direction DR3 as shown in FIG. 1. Therefore, the buried contact 140 may be spaced apart from the bit line structures 135_1 and 135_2 by the spacer structures 150_1 and 150_2.

The spacer structures 150_1 and 150_2 may include a first spacer structure 150_1 disposed on the side surface of the first bit line structure 135_1 and a second spacer structure 150_2 disposed on the side surface of the second bit line structure 135_2. For example, the buried contact 140 may be disposed between the first spacer structure 150_1 and the second spacer structure 150_2.

A part of the first spacer structure 150_1 may be disposed in the first trench 136t. For example, as shown in FIG. 2, the lower portion of the first spacer structure 150_1 may extend along the side surface of the buried contact 140. The lower portion of the buried contact 140 may fill a part of the first trench 136t, and the lower portion of the first spacer structure 150_1 may fill another part of the first trench 136t. The second spacer structure 150_2 may be disposed on the insulating pattern 120.

The spacer structures 150_1 and 150_2 may be single layers, but as shown in FIG. 2, they may be multilayers. For example, the first spacer structure 150_1 may include first to fifth spacers 151, 152, 153, 154, and 155, and the second spacer structure 150_2 may include the first spacer 151 and the third to fifth spacers 153, 154, and 155.

The first spacer 151 may extend along at least a part of the side surfaces of the bit line structures 135_1 and 135_2. The first spacer 151 of the first spacer structure 150_1 may extend along the side surface of the direct contact 136, the side surface of the first bit line structure 135_1, and the first trench 136t. The first spacer 151 of the second spacer structure 150_2 may extend along the side surface of the second bit line structure 135_2 and the top surface of the insulating pattern 120. Alternatively or additionally, the first spacer 151 of the first spacer structure 150_1 may contact at least a part of the direct contact 136 and at least a part of the first bit line structure 135_1. The first spacer 151 of the second spacer structure 150_2 may contact at least a part of the second bit line structure 135_2.

In some example embodiments, the first spacer 151 may be made of, e.g. may include or may consist of or consist essentially of, silicon nitride.

The second spacer 152 may be disposed on the first spacer 151. The second spacer 152 may fill the first trench 136t. The second spacer 152 may fill the remaining first trench 136t after the formation of the direct contact 136 and the first spacer 151.

In some example embodiments, the top surface 141u of the first portion 141 may be lower than the top surface of the second spacer 152.

In some example embodiments, the second spacer 152 may be made of, e.g. may include or may consist of or may consist essentially of, silicon nitride.

The third spacer 153 may be disposed on the first spacer 151 or the second spacer 152 and may extend along the side surfaces of the bit line structures 135_1 and 135_2. The third spacer 153 of the first spacer structure 150_1 may be disposed on the top surface of the second spacer 152 and may extend along at least a part of the side surface of the direct contact 136 and at least a part of the side surface of the first bit line structure 135_1. The third spacer 153 of the second spacer structure 150_2 may be disposed on the top surface of the first spacer 151 and may extend along at least a part of the side surface of the second bit line structure 135_2. The third spacer 153 may be defined by the first, second, and fourth spacers 151, 152, and 154.

In some example embodiments, the third spacer 153 may be an air spacer. The third spacer 153 may be formed of, include, consist of, or consist essentially of air such as a clean, dry air, or may be formed of a void. The third spacer 153 may be under vacuum, e.g. may have a pressure less than that of atmospheric pressure. The third spacer 153 has a dielectric constant less than that of silicon oxide. Therefore, the parasitic capacitance of the semiconductor device according to some example embodiments may be effectively reduced.

The fourth spacer 154 may be disposed on, e.g. directly on, the third spacer 153 and may extend along the side surfaces of the bit line structure 135_1 and 135_2. The fourth spacer 154 may be spaced apart from the first spacer 151 by the third spacer 153. The fourth spacer 154 included in the first spacer structure 150_1 may be disposed above the first spacer 151 extending along the first trench 136*t* and may extend along the side surface of the third spacer 153. The fourth spacer 154 included in the second spacer structure 150_2 may be disposed on the substrate 100 and may extend along the side surface of the insulating pattern 120 and the side surface of the second bit line structure 135_2.

In some example embodiments, at least a part of a bottom surface 154*b* of the fourth spacer 154 included in the first spacer structure 150_1 may be higher than the top surface 141*u* of the first portion 141 of the buried contact 140. The bottom surface 154*b* of the fourth spacer 154 included in the first spacer structure 150_1 may be disposed on the first spacer 151 and the second spacer 152. At least a part of the bottom surface 154*b* of the fourth spacer 154 included in the first spacer structure 150_1 may be recessed into the second spacer 152.

In some example embodiments, the fourth spacer 154 may be made of, e.g. may include, or consist of, or consist essentially of, silicon nitride.

The fifth spacer 155 may be disposed on the fourth spacer 154 and may extend along the side surfaces of the bit line structures 135_1 and 135_2. The fifth spacer 155 may be spaced apart from the third spacer 153 by the fourth spacer 154.

The fifth spacer 155 may be disposed on the outermost sides of the spacer structures 150_1 and 150_2. The fifth spacer 155 may be disposed on the buried contact 140. The fifth spacer 155 may be disposed on the top surface 141*u* of the first portion 141 of the buried contact 140 and may extend along the side surface of the second portion 142 of the buried contact 140. Accordingly, the bottom surface of the fifth spacer 155 may be placed on the top surface 141*u* of the first portion 141 of the buried contact 140. For example, the bottom surface of the fifth spacer 155 may be positioned on the boundary surface between the first portion 141 and the second portion 142 of the buried contact 140.

Alternatively or additionally, the fifth spacer 155 may contact the top surface 141*u* of the first portion 141 of the buried contact 140 and the side surface of the second portion 142 of the buried contact 140.

In some example embodiments, the top surface 141*u* of the first portion 141 of the buried contact 140 may have the width W1 substantially equal to a distance D between the fourth spacers 154 spaced apart by the second portion 142 of the buried contact 140. For example, the width W1 of the top surface 141*u* of the first portion 141 of the buried contact 140 may be substantially the same as the distance D between the fourth spacer 154 of the first spacer structure 150_1 and the fourth spacer 154 of the second spacer structure 150_2 that are spaced apart by the buried contact 140.

In some example embodiments, the fifth spacer 155 may be made of, e.g. may include or consist of or consist essentially of, silicon oxide. Accordingly, the side surface of the second portion 142 of the buried contact 140 may contact the fifth spacer 155 made of silicon oxide.

When the spacer that is in contact with the buried contact 140 is made of or consists of silicon nitride, the silicon nitride may contact a depletion region of the buried contact 140 to form interface traps. The interface traps may increase the resistance of the buried contact 140 and may increase the leakage current. Further, as the semiconductor device becomes more highly integrated, the effects of the parasitic capacitance and the leakage current increase more and more. For example, as a gap between conductive patterns of a dynamic random access memory (DRAM) becomes narrower, the parasitic capacitance between the conductive patterns may be increased.

However, since the buried contact 140 in the semiconductor device according to some example embodiments is in contact with the fifth spacer 155 made of or including or consisting of or consisting essentially of silicon oxide, the formation of the interface traps may be reduced. Accordingly, the resistance of the buried contact 140 may be reduced and the leakage current may be reduced. Alternatively or additionally, in the semiconductor device according to some example embodiments, the parasitic capacitance of the semiconductor device may be further effectively reduced by the third spacer 153 that is an air spacer and the fifth spacer 155 made of or including or consisting of or consisting essentially of silicon oxide, thereby improving the operating characteristics.

The silicide layer 145 may be formed on the buried contact 140. The silicide layer 145 may cover a part of the top surface of the buried contact 140, or may completely cover the top surface of the buried contact 140 as shown in FIG. 2. Unlike the example shown in FIG. 2, the silicide layer 145 may be omitted on the buried contact 140 and the landing pad 160. The silicide layer 145 may include, for example, at least one of cobalt silicide (CoSix), tungsten silicide (WSix), or nickel silicide (NiSi), but example embodiments are not limited thereto.

The landing pad 160 may be formed on the silicide layer 145. The landing pad 160 may be electrically connected to the buried contact 140 through the silicide layer 145. In some example embodiments, the top surface of the landing pad 160 may be higher than the top surfaces of the bit line structures 135_1 and 135_2. For example, the landing pad 160 may cover a part of the top surfaces of the bit line structures 135_1 and 135_2.

The landing pads 160 may form a plurality of isolated regions separated from each other. Although FIG. 1 illustrates that each landing pad 160 has a circular shape, this is only an example and the technical spirit of the present disclosure is not limited thereto. Further, although it is illustrated in FIG. 1 that the plurality of landing pads 160 are arranged in a honeycomb structure, this is only an example and example embodiments are limited thereto.

The plurality of landing pads 160 may be connected to the buried contacts 140 forming a plurality of isolated regions. For example, the landing pads 160 may be separated from each other by a second trench 180*t*.

The landing pad 160 may include a conductive material. Accordingly, the capacitor structure 190 may be electrically connected to the active region AR of the substrate 100. The landing pad 160 may include, for example, tungsten (W), without being limited thereto.

In some example embodiments, a part of the second trench 180*t* may expose a part of the bit line structures 135_1 and 135_2. For example, the second trench 180*t* may extend from the top surface of the landing pad 160 to be lower than the top surfaces of the bit line structures 135_1 and 135_2. Accordingly, the plurality of landing pads 160 may be separated from each other by the bit line structures 135_1 and 135_2 and the second trench 180*t*. In some example embodiments, the bottom surface of the second trench 180*t* may be higher than the bottom surface of the capping pattern 134. Accordingly, the second trench 180*t* may expose a part of the capping pattern 134.

Since the spacer structures 150_1 and 150_2 may be interposed between the bit line structures 135_1 and 135_2 and the buried contact 140, the second trench 180*t* may expose at least a part of the top surfaces of the first spacer 151, the third spacer 153, the fourth spacer 154, and the fifth spacer 155.

The interlayer insulating layer 180 may be formed on a part of the top surface of the landing pad 160 and a part of the bit line structures 135_1 and 135_2. The interlayer insulating layer 180 may define a region of the landing pad 160 forming a plurality of isolated regions. For example, the interlayer insulating layer 180 may fill the second trench 180t. Accordingly, the interlayer insulating layer 180 may separate the plurality of landing pads 160 from each other. In addition, the interlayer insulating layer 180 may be patterned to expose a part of the top surface of each landing pad 160.

In some example embodiments, the interlayer insulating layer 180 may include an insulating material to electrically separate the plurality of landing pads 160 from each other. For example, the interlayer insulating layer 180 may include at least one of silicon oxide, silicon oxynitride, silicon nitride, or a low-k material having a lower dielectric constant than silicon oxide, but is not limited thereto.

The capacitor structure 190 may be disposed on the interlayer insulating layer 180 and the landing pad 160. The capacitor structure 190 may be connected to a part of the top surface of the landing pad 160 exposed by the interlayer insulating layer 180. As a result, the capacitor structure 190 may be electrically connected to the landing pad 160, the silicide layer 145, and the source/drain region connected to the buried contact 140. Accordingly, the capacitor structure 190 may store electric charges in a semiconductor memory element or the like.

For example, as shown in FIGS. 2 and 4, the capacitor structure 190 may include a lower electrode 191, a capacitor dielectric layer 192, and an upper electrode 193. The capacitor structure 190 may store electric charges in the capacitor dielectric layer 192 by using a potential difference generated between the lower electrode 191 and the upper electrode 193.

The lower electrode 191 and the upper electrode 193 may include, for example, at least one of doped polysilicon, metal, or metal nitride, without being limited thereto. Alternatively or additionally, the capacitor dielectric layer 192 may include, for example, silicon oxide and/or a high-k material, without being limited thereto.

Figure 5:
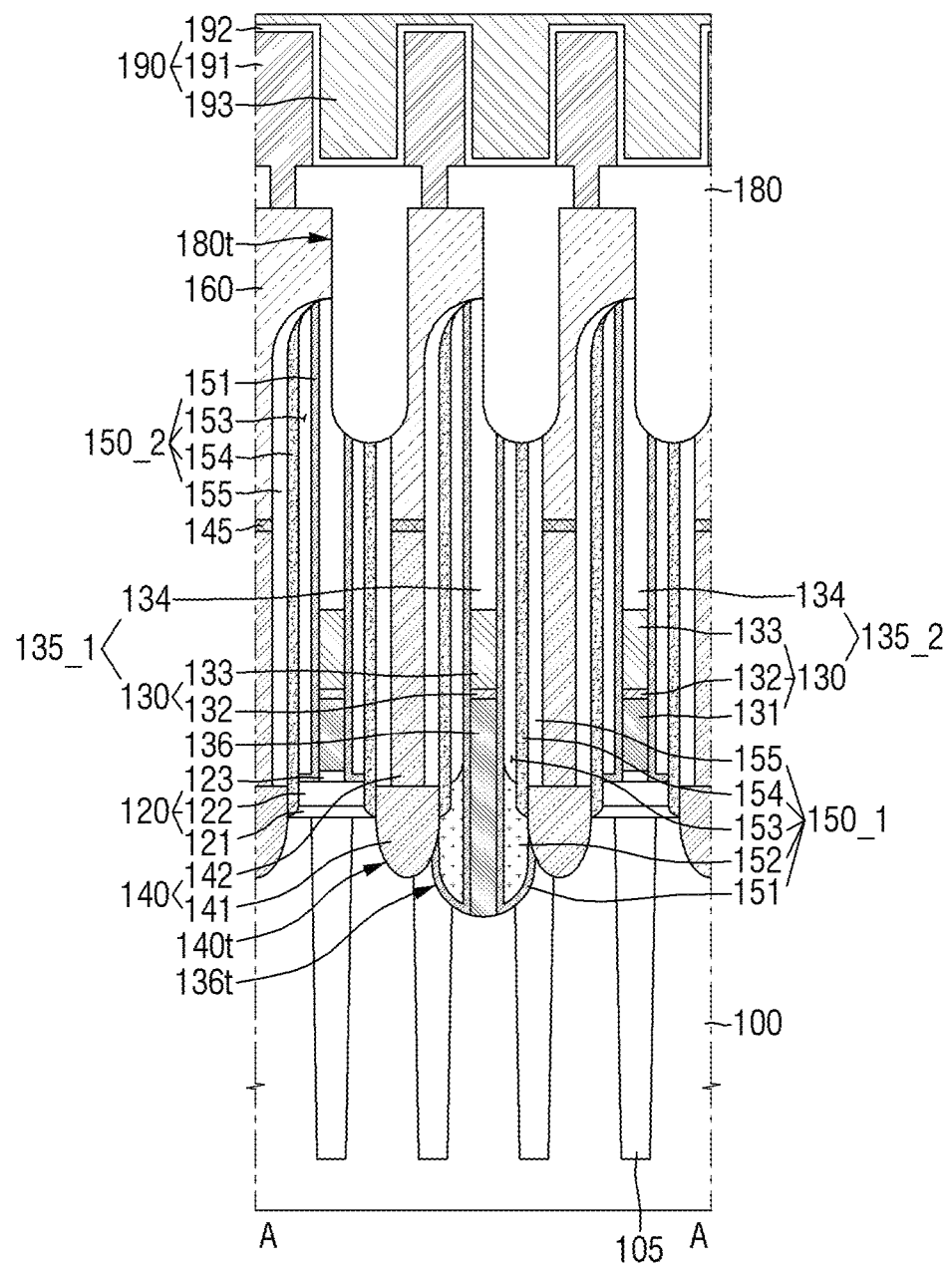
FIG. 5 is a cross-sectional view illustrating a semiconductor device according to some example embodiments.

FIG. 5 is a cross-sectional view illustrating a semiconductor device according to some example embodiments. For simplicity of description, redundant parts of the description made with reference to FIGS. 1 to 4 may be recapitulated or omitted.

Referring to FIG. 5, in the semiconductor device according to some example embodiments, the top surface of the first portion 141 of the buried contact 140 may be higher than the top surface of the substrate 100.

The top surface of the first portion 141 of the buried contact 140 may be, for example, lower than the uppermost surface of the second spacer 152, as shown in FIG. 5. Alternatively, unlike the example illustrated in FIG. 5, the top surface of the first portion 141 of the buried contact 140 may be higher than the uppermost surface of the second spacer 152.

The top surface of the first portion 141 of the buried contact 140 may be higher than the bottom surface of the fourth spacer 154. Accordingly, the fourth spacer 154 may extend along at least a part of the side surface of the first portion 141 of the buried contact 140. In addition, the fourth spacer 154 may contact at least a part of the side surface of the first portion 141 of the buried contact 140.

Figure 6:
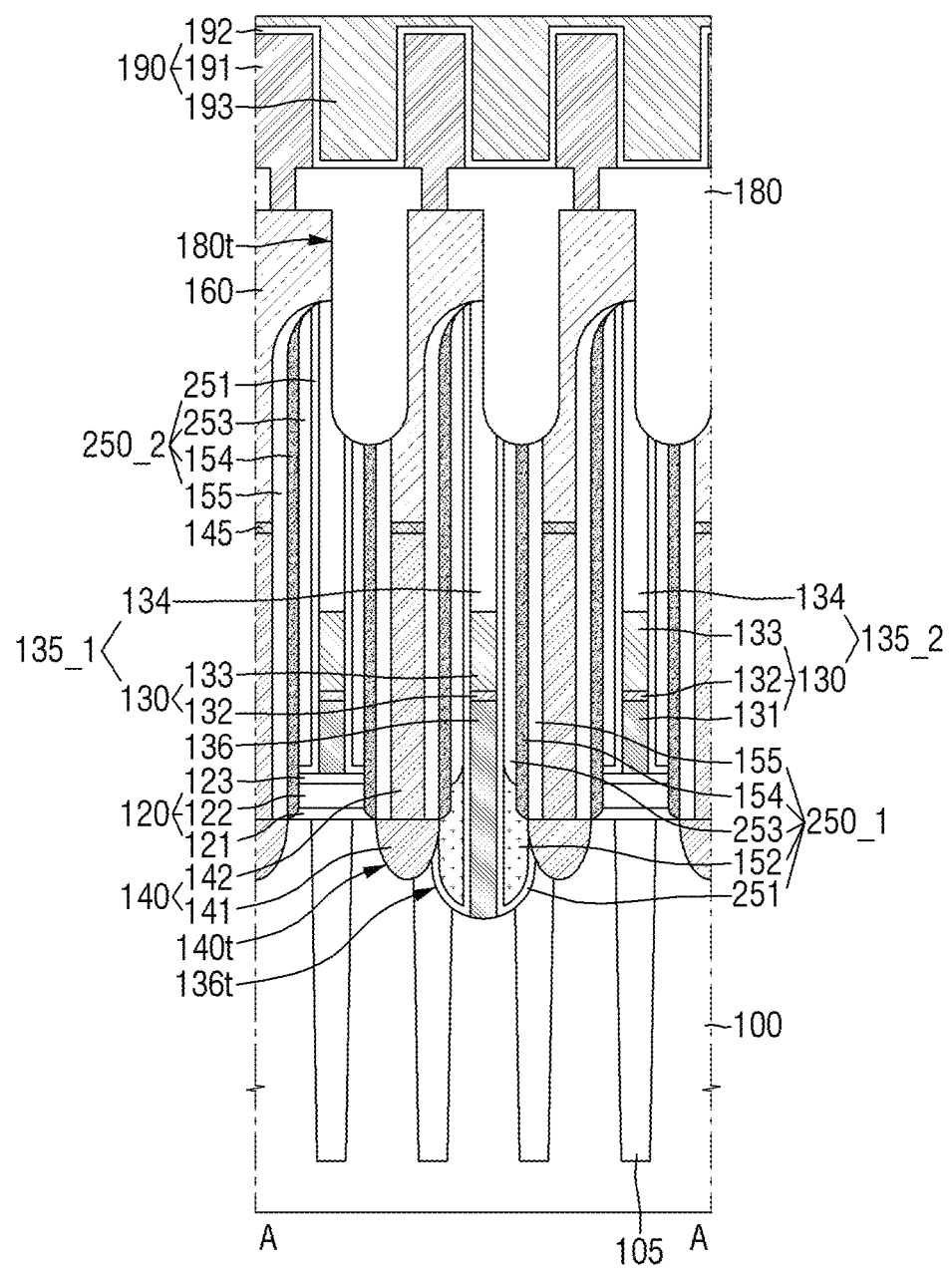
FIG. 6 is a cross-sectional view illustrating a semiconductor device according to some example embodiments.

FIG. 6 is a cross-sectional view illustrating a semiconductor device according to some example embodiments. For simplicity of description, redundant parts of the description made with reference to FIGS. 1 to 4 may be recapitulated or omitted.

Referring to FIG. 6, in the semiconductor device according to some example embodiments, a first spacer 251 and a third spacer 253 included in spacer structures 250_1 and 250_2 may be made of, e.g. may consist of, the same material. The boundary between the first spacer 251 and the third spacer 253 may not be distinguished. For example, there may not be an observable interface between the first spacer 251 and the third spacer 253.

The first spacer 251 and the third spacer 253 may be made of, e.g. may consist of or consist essentially of, silicon oxide, and may not include silicon nitride. Therefore, not only the side surface of the direct contact 136 but also the side surfaces of the bit line structure 135_1 and 135_2 may contact the first spacer 251 made of silicon oxide. Accordingly, the formation of the interface traps in the buried contact 140 may be reduced, and thus the resistance of the buried contact 140 may be reduced, thereby also reducing the leakage current. Alternatively or additionally, the parasitic capacitance of the semiconductor device may be further effectively reduced, thereby improving the operating characteristics.

In some example embodiments, the width of the third insulating layer 123 may be substantially the same as the width of the first and second insulating layers 121 and 122.

The spacer structures 250_1 and 250_2 shown in FIG. 6 may also be applied to the semiconductor devices shown in FIGS. 2 and 5.

Figure 7:
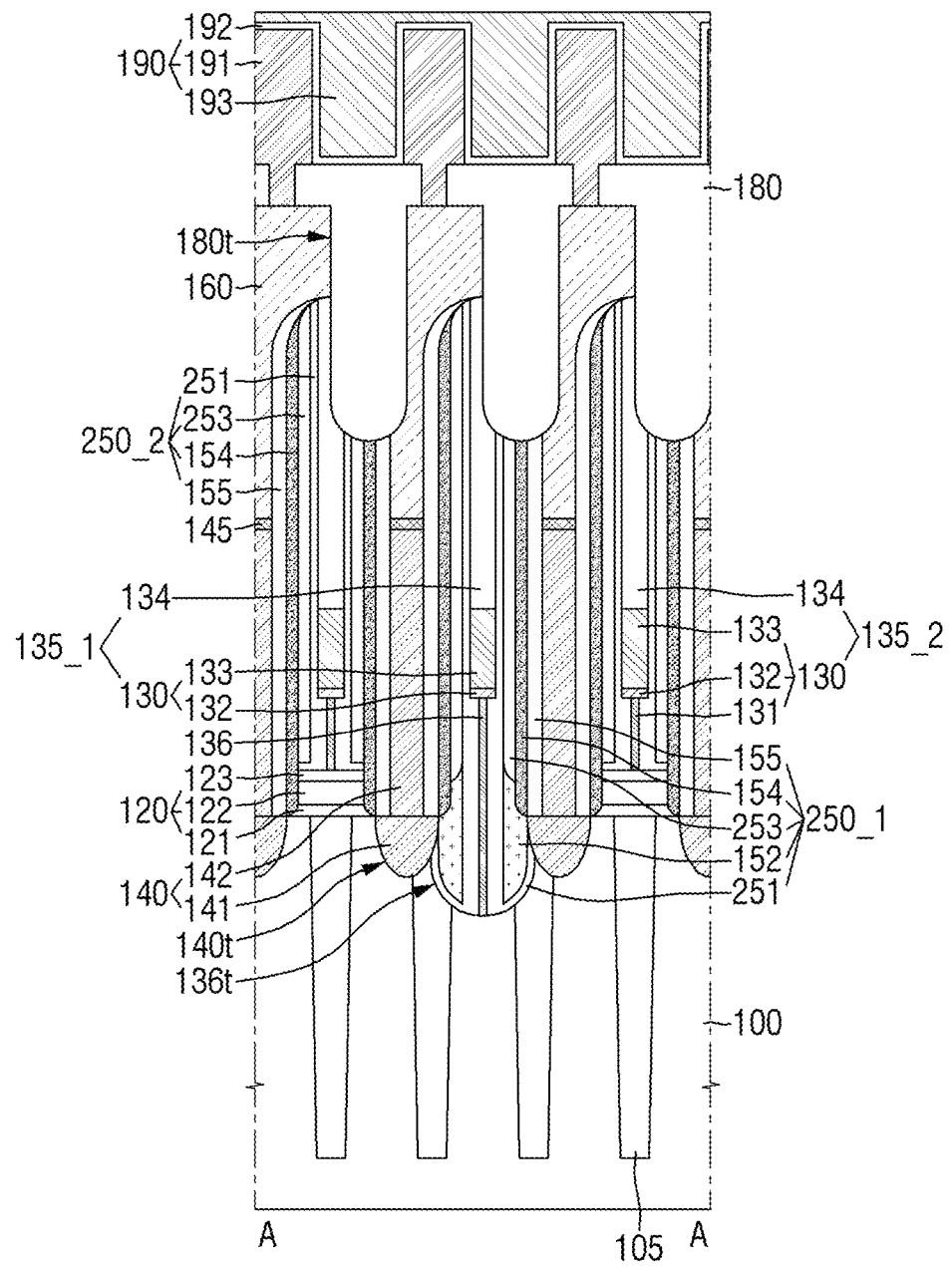
FIG. 7 is a cross-sectional view illustrating a semiconductor device according to some example embodiments.
Figure 7:
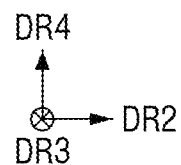

FIG. 7 is a cross-sectional view illustrating a semiconductor device according to some example embodiments. For simplicity of description, redundant parts of the description made with reference to FIG. 6 may be recapitulated or omitted.

Referring to FIG. 7, in the semiconductor device according to some example embodiments, the width of the direct contact 136 may be different from the width of the bit line structures 135_1 and 135_2. The width of the direct contact 136 may be smaller than the width of the bit line structures 135_1 and 135_2.

The width of the first conductive layer 131 may be smaller than, e.g., the width of the bit line structures 135_1 and 135_2. The width of the first conductive layer 131 may be substantially the same as or greater than the width of the direct contact 136.

Figure 8:
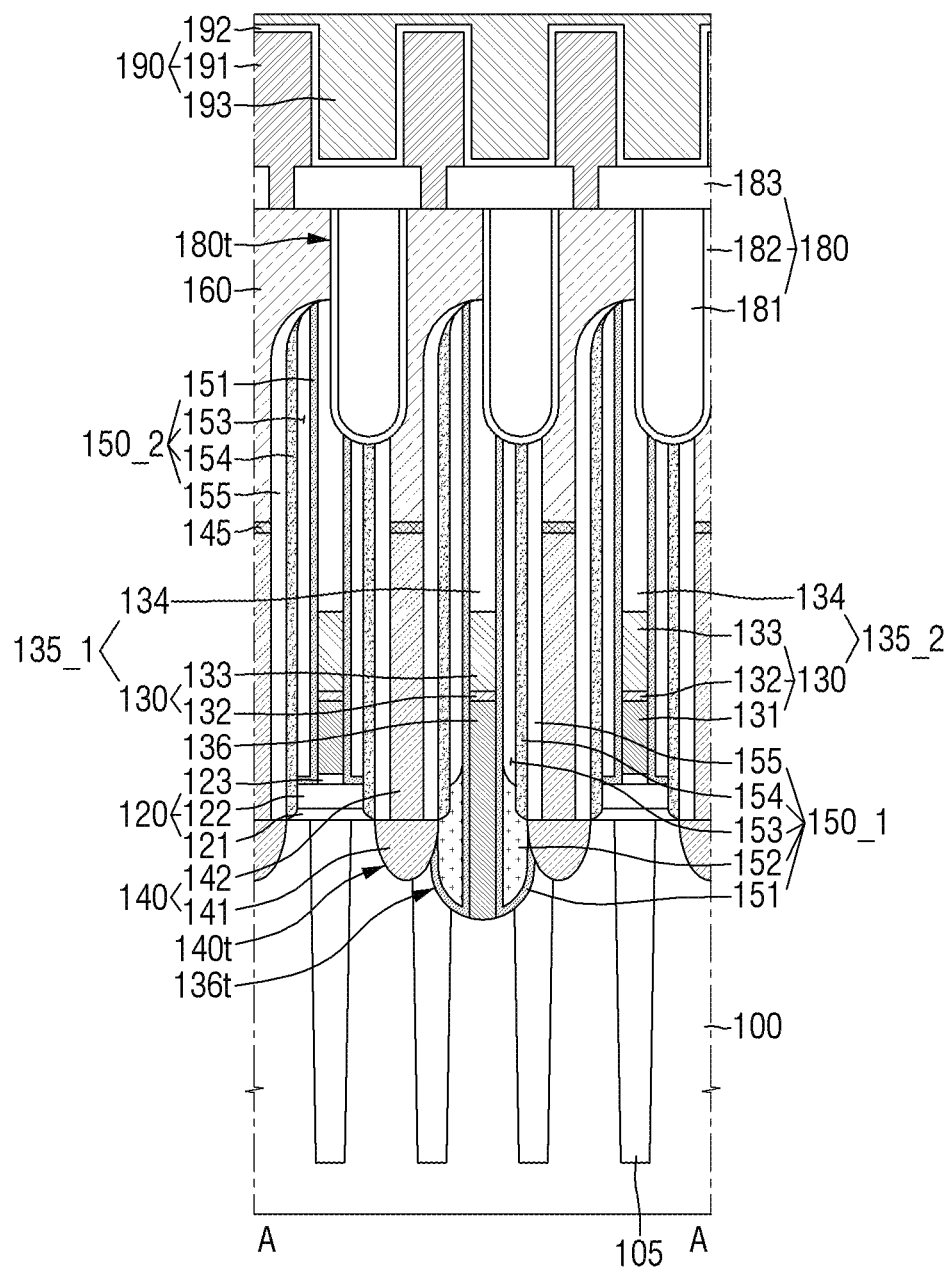
FIG. 8 is a cross-sectional view illustrating a semiconductor device according to some example embodiments.

FIG. 8 is a cross-sectional view illustrating a semiconductor device according to some example embodiments. For simplicity of description, redundant parts of the description made with reference to FIGS. 1 to 4 may be recapitulated or omitted.

Referring to FIG. 8, in a semiconductor device according to some example embodiments, the interlayer insulating layer 180 may include first to third layers 181, 182, and 183.

The first layer 181 may extend along the second trench 180t. The first layer 181 may conformally extend along the second trench 180t. The second layer 182 may fill the second trench 180t on the first layer 181. The second layer 182 may fill the remaining second trench 180t after the formation of the first layer 181. Accordingly, the first and second layers 181 and 182 may define a region of the landing pads 160 forming a plurality of isolated regions. The first and second layers 181 and 182 may separate the plurality of landing pads 160 from each other. In some example embodiments, the first layer 181 and the second layer 182 may be disposed on substantially the same plane as the top surfaces of the plurality of landing pads 160.

The third layer 183 may be disposed on the first layer 181, the second layer 182, and the landing pad 160. For example, the third layer 183 may be patterned to expose a part of the top surfaces of the landing pads 160.

In some example embodiments, the step coverage of the first layer 181 may be superior to the step coverage of the second layer 182. For example, the first layer 181 may be formed of SiCN, the second layer 182 may be formed of, e.g. may consist of or include or consist essentially of, SiN, and the third layer 183 may be formed of, e.g. may consist of or include or consist essentially of, SIBN. Accordingly, the interlayer insulating layer 180 may electrically separate the plurality of landing pads 160 from each other.

The spacer structures 250_1 and 250_2 shown in FIG. 7 may be applied to the semiconductor device shown in FIG. 8.

Figure 9:
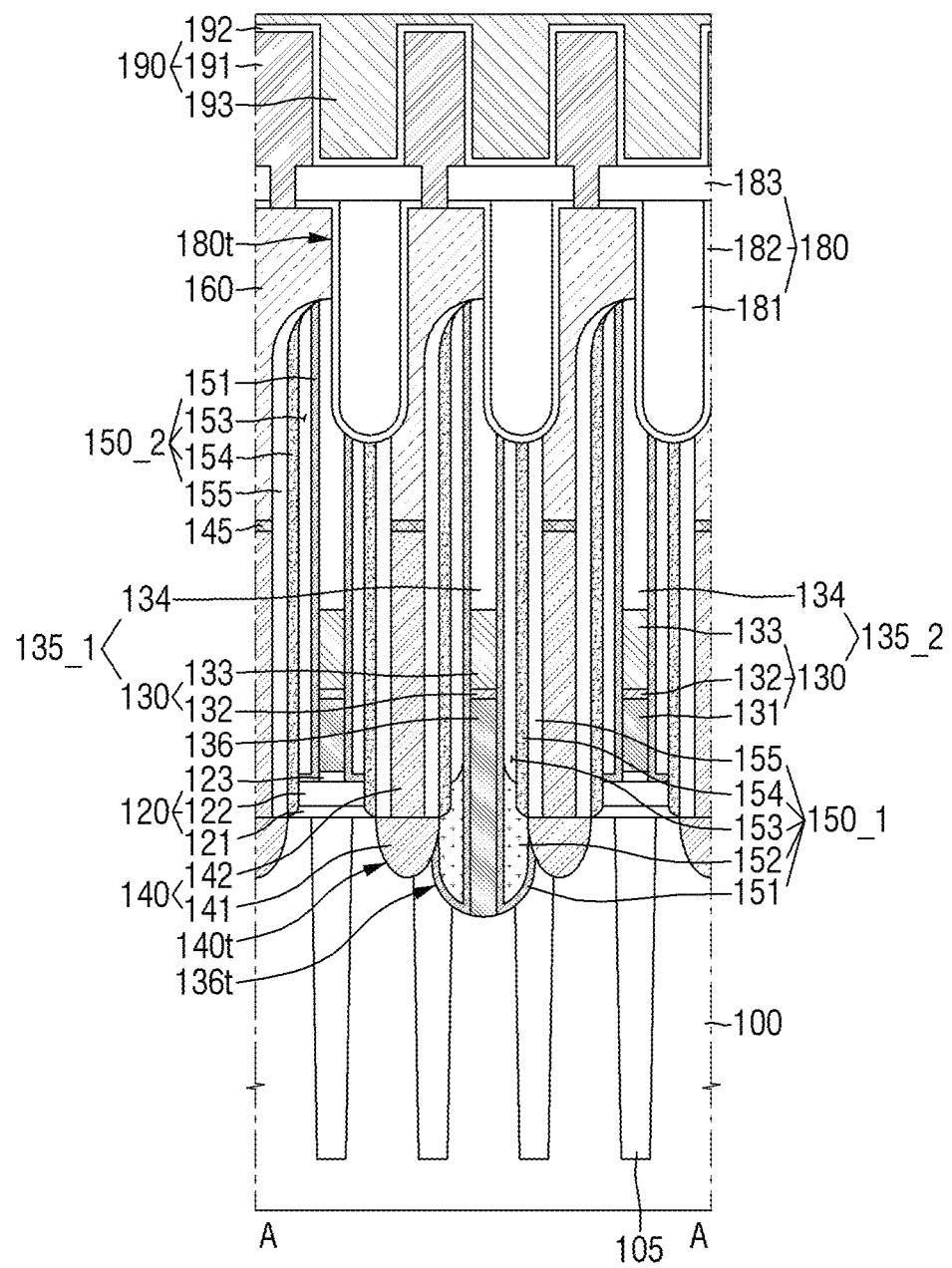
FIG. 9 is a cross-sectional view illustrating a semiconductor device according to some example embodiments.

FIG. 9 is a cross-sectional view illustrating a semiconductor device according to some example embodiments. For simplicity of description, redundant parts of the description made with reference to FIG. 8 may be recapitulated or omitted.

Referring to FIG. 9, in the semiconductor device according to some example embodiments, the first layer 181 may extend along the second trench 180*t* and the top surface of the landing pad 160. The first layer 181 may conformally extend along the second trench 180*t* and the top surface of landing pad 160. The top surface of the first layer 181 may be disposed on substantially the same plane as the top surface of the second layer 182, and the top surface of the first layer 181 may be higher than the top surface of the landing pad 160. The third layer 183 may be disposed on the first and second layers 181 and 182.

FIGS. 10 to 25 are views illustrating the intermediate steps of a method for fabricating a semiconductor device according to some example embodiments. For simplicity of description, redundant parts of the description made with reference to FIGS. 1 to 4 may be recapitulated or omitted. For reference, FIGS. 10 to 25 are cross-sectional views taken along line A-A of FIG. 1.

Figure 10:
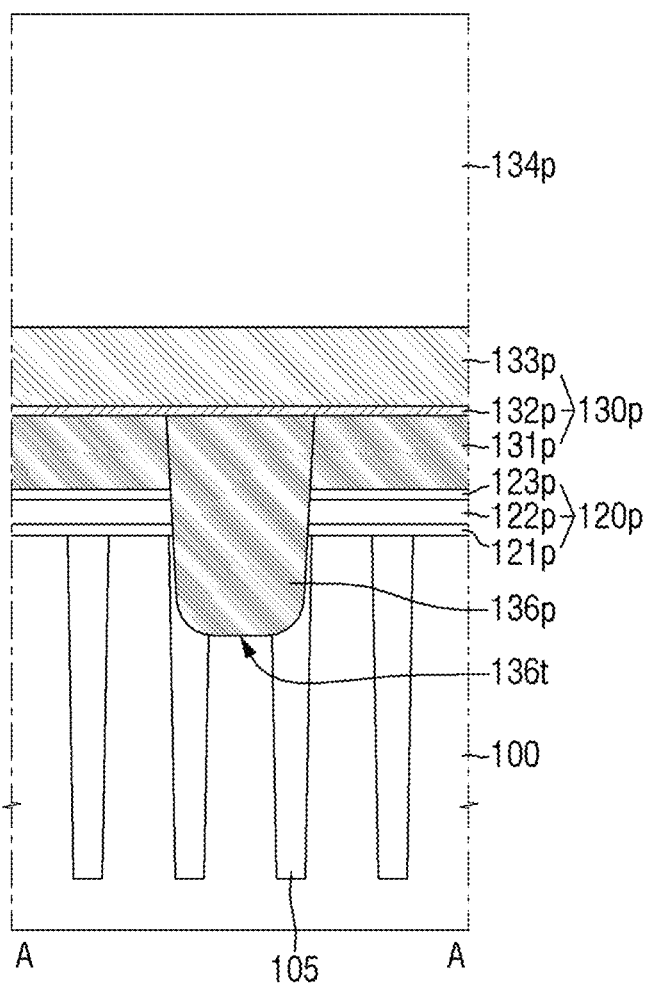
FIGS. 10 to 25 are views illustrating the intermediate steps of a method for fabricating a semiconductor device according to some example embodiments.

Referring to FIG. 10, first to third pre-insulating layers 121*p*, 122*p*, and 123*p*, first to third pre-conductive layers 131*p*, 132*p*, and 133*p*, a pre-direct contact 136*p*, and a pre-capping pattern 134*p* may be sequentially formed on the substrate 100 and the element isolation layer 105.

For example, the first to third pre-insulating layers 121*p*, 122*p*, and 123*p* and the first to third pre-conductive layers 131*p*, 132*p*, and 133*p* may be sequentially formed, e.g. formed with a deposition process such as a chemical vapor deposition (CVD) process, on the substrate 100 and the element isolation layer 105. Next, the first trench 136*t* may be formed in the substrate 100 to expose a part of the active region AR (see FIG. 1). In some example embodiments, the first trench 136*t* may expose the center of the active region AR. Next, the pre-direct contact 136*p* that fills the first trench 136*t* may be formed. Next, the second pre-conductive layer 132*p*, the third pre-conductive layer 133*p*, and the pre-capping pattern 134*p* may be sequentially formed on the first pre-conductive layer 131*p* and the pre-direct contact 136*p*.

Figure 11:
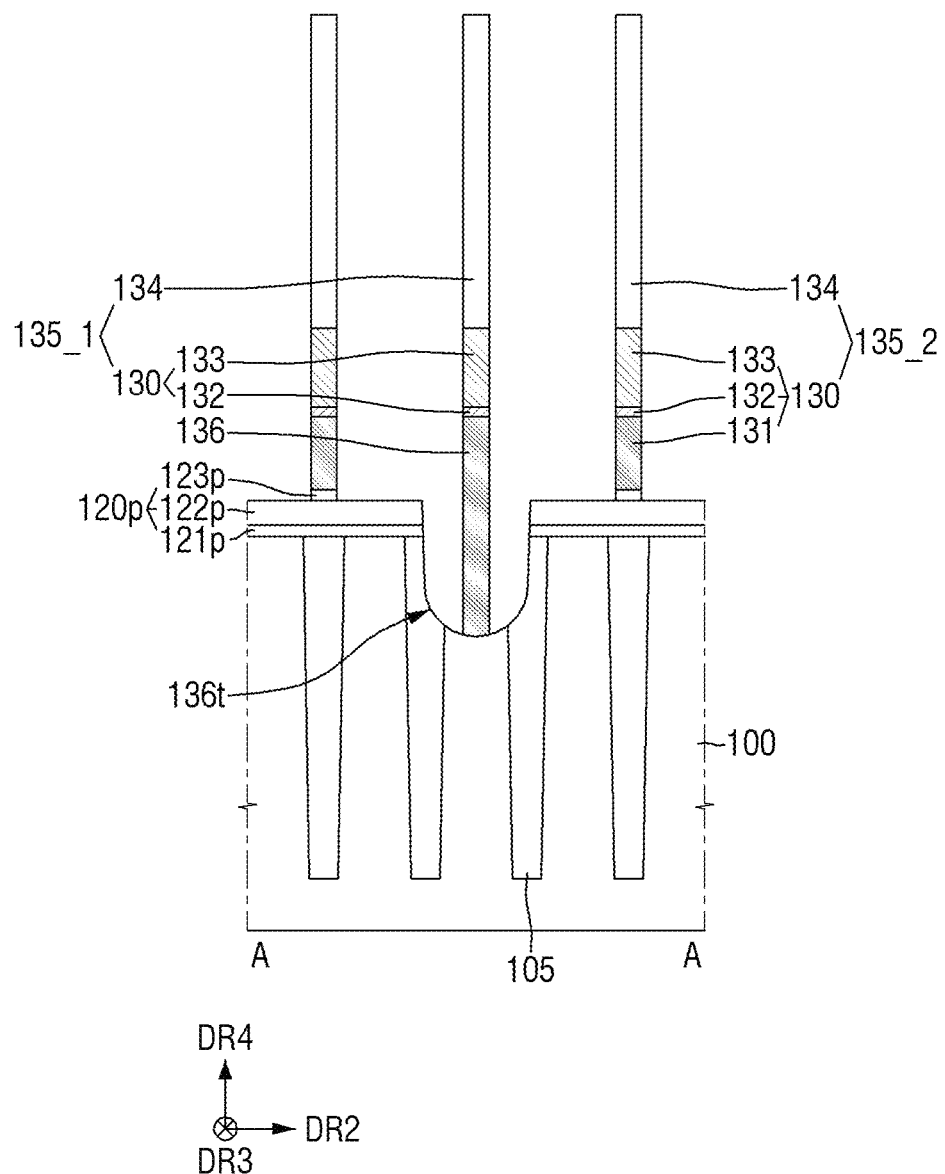

Referring to FIG. 11, the first to third pre-conductive layers (131*p*, 132*p*, and 133*p* in FIG. 10), the pre-direct contact (136*p* in FIG. 10), and the pre-capping pattern (134*p* in FIG. 10) may be patterned, e.g. patterned with a photo-lithographic process and an etching process such as a reactive ion etching (RIE) process.

Accordingly, the bit line structures 135_1 and 135_2 elongated along the third direction DR3 (see FIG. 1) across the third insulating layer 123, the active region AR (see FIG. 1) and the word line structure 110 (see FIG. 1) may be formed. In some example embodiments, the width of the bit line structures 135_1 and 135_2 and the width of the direct contact 136 may be smaller than the width of the first trench 136*t*. For example, the patterned bit line structures 135_1 and 135_2 and the patterned direct contact 136 may not completely fill the first trench 136*t*.

In some example embodiments, the third pre-insulating layer 123*p* may also be patterned. The third pre-insulating layer 123*p* may be patterned to have substantially the same width as that of the bit line structures 135_1 and 135_2.

Figure 12:
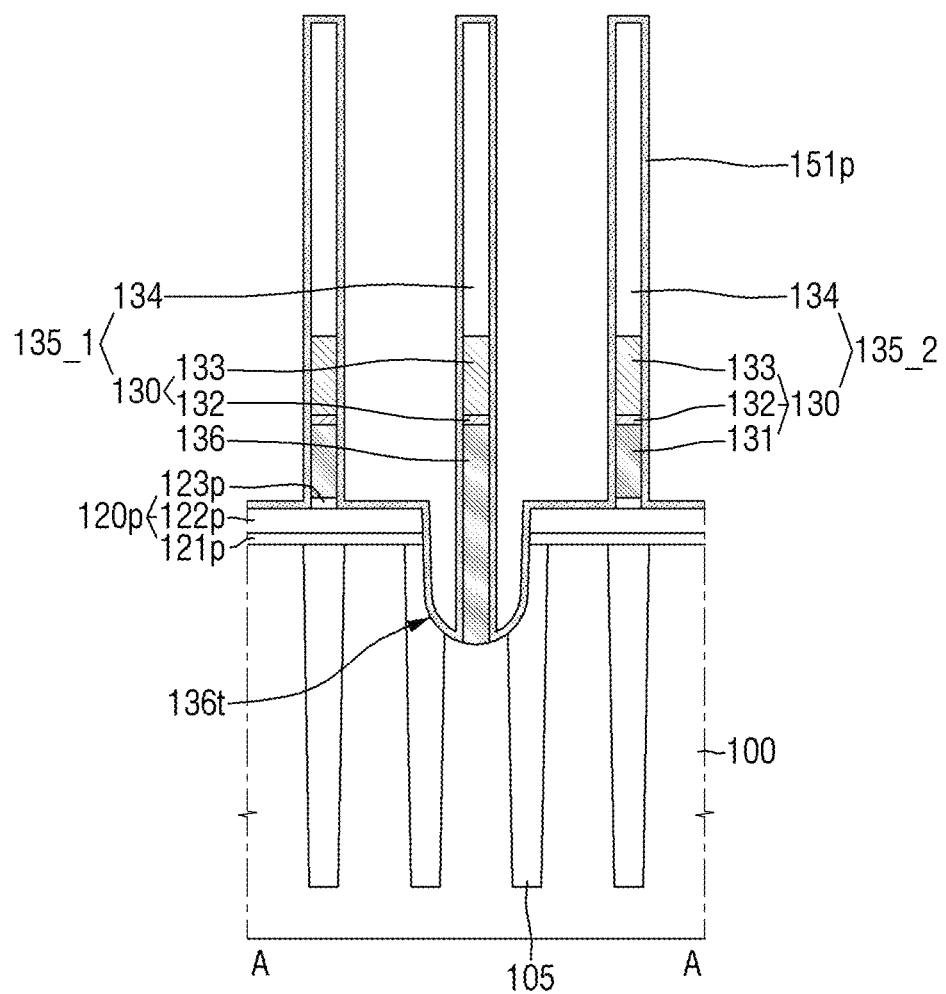

Referring to FIG. 12, a first pre-spacer layer 151*p* may be conformally formed, e.g. formed with a CVD process. The first pre-spacer layer 151*p* may extend along the side surfaces and the top surfaces of the bit line structures 135_1 and 135_2, the side surface of the direct contact 136, the side surface and the top surface of a pre-insulating pattern 120*p*, and the profile of the first trench 136*t*.

The first pre-spacer layer 151*p* may be formed of, e.g. may include, consist of, or consist essentially of, silicon nitride.

Figure 13:
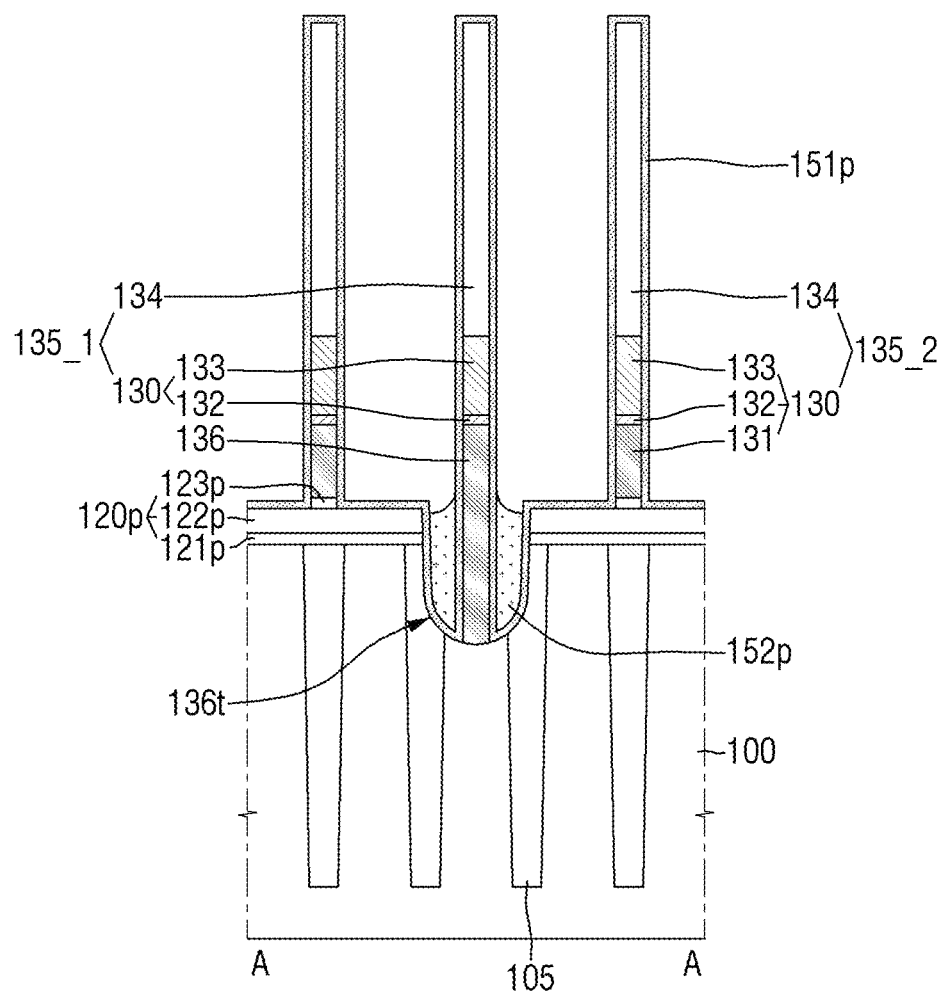

Referring to FIG. 13, a second pre-spacer layer 152*p* may be formed. The second pre-spacer layer 152*p* may be formed in the first trench 136*t* on the first pre-spacer layer 151*p*. The second pre-spacer layer 152*p* may fill an area of the first trench 136*t* remaining after the first pre-spacer layer 151*p* is filled.

For example, the second pre-spacer layer 152*p* may be formed on the first pre-spacer layer 151*p*. A part of the second pre-spacer layer 152*p* may be etched by using the first pre-spacer layer 151*p* as an etch stop layer.

The second pre-spacer layer 152*p* may be formed of, e.g. may include, consist of, or consist essentially of, silicon nitride.

In FIG. 13, the top surface of the second pre-spacer layer 152*p* is shown to have at least partially a convex shape toward the substrate 100, but this is merely a characteristic of the process, and the technical spirit of example embodiments are not limited thereto.

Figure 14:
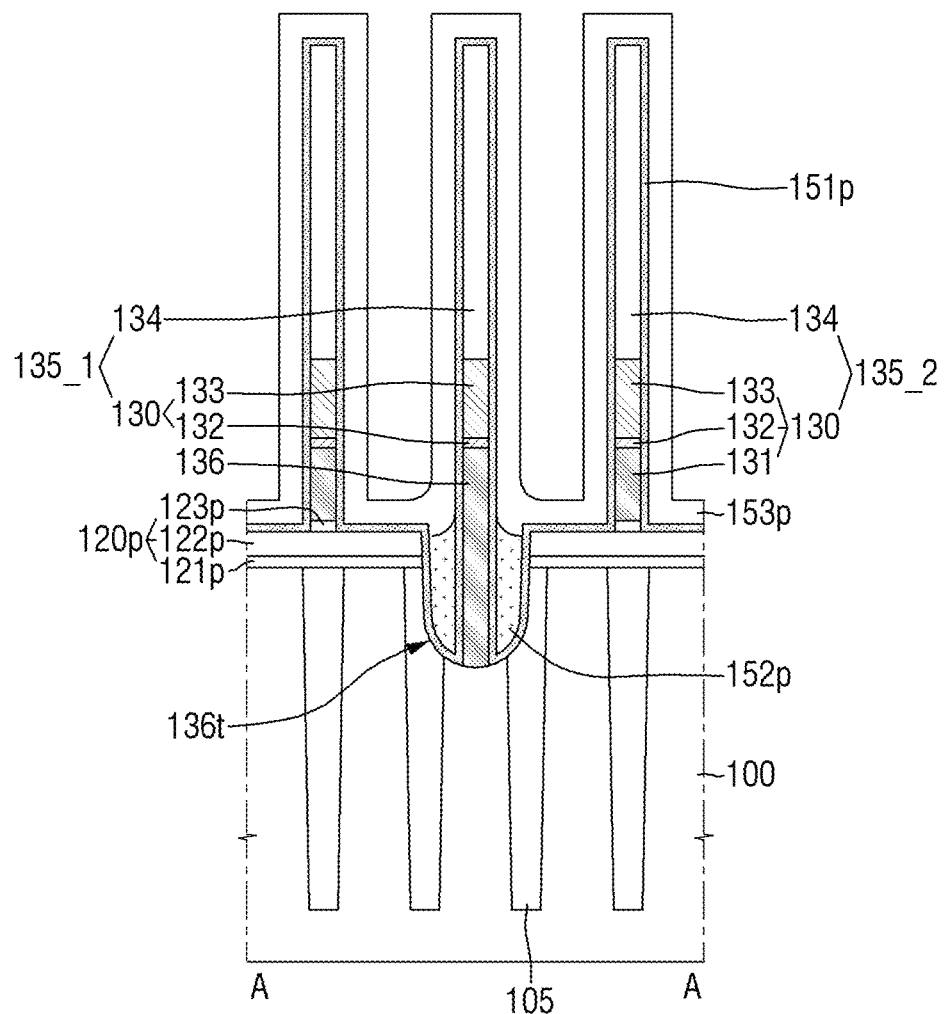

Referring to FIG. 14, a third pre-spacer layer 153*p* may be conformally formed. The third pre-spacer layer 153*p* may extend along the side surface and top surface of the first pre-spacer layer 151*p* and along the top surface of the second pre-spacer layer 152*p*.

The third pre-spacer layer 153*p* may be formed of silicon oxide. For example, the third pre-spacer layer 153*p* may be formed by an atomic layer deposition (ALD) process.

Figure 15:
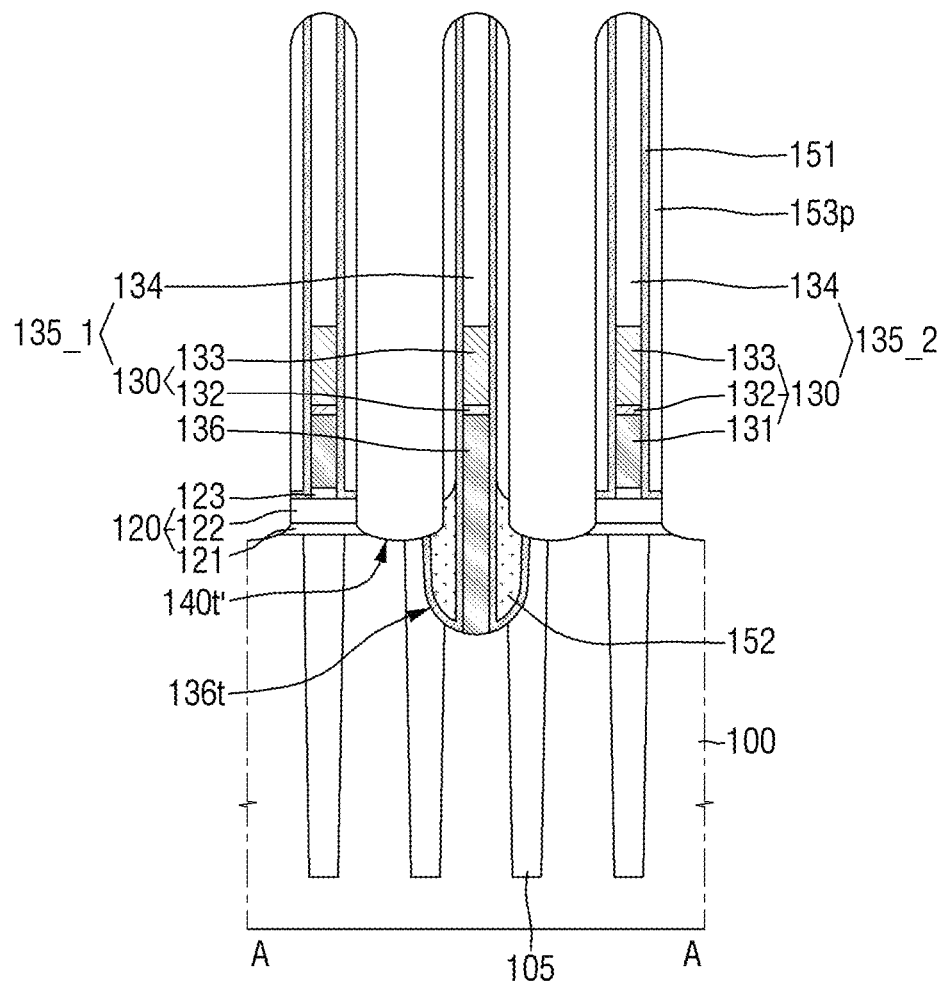

Referring to FIG. 15, a pre-contact recess 140*t'* may be formed between the bit line structures 135_1 and 135_2. The bottom surface of the pre-contact recess 140*t'* may be disposed on substantially the same plane as the top surface of the substrate 100 or may be lower than the top surface of the substrate 100.

The pre-contact recess 140*t'* may penetrate the pre-insulating pattern 120*p* (see FIG. 14) and the first and third pre-spacer layers 151*p* and 153*p* (see FIG. 14) to expose a part of the active region AR. In addition, the first and third pre-spacer layers 151*p* and 153*p* on the top surfaces of the bit line structures 135_1 and 135_2 may be removed. Accordingly, the first spacer 151 disposed on the side surfaces of the insulating pattern 120 and the second bit line structure 135_2 may be formed. In some example embodiments, the pre-contact recess 140*t'* may expose both ends of the active region AR (see FIG. 1).

In addition, at least a part of the top surface of the second pre-spacer layer 152p (see FIG. 14) may be etched.

Figure 16:
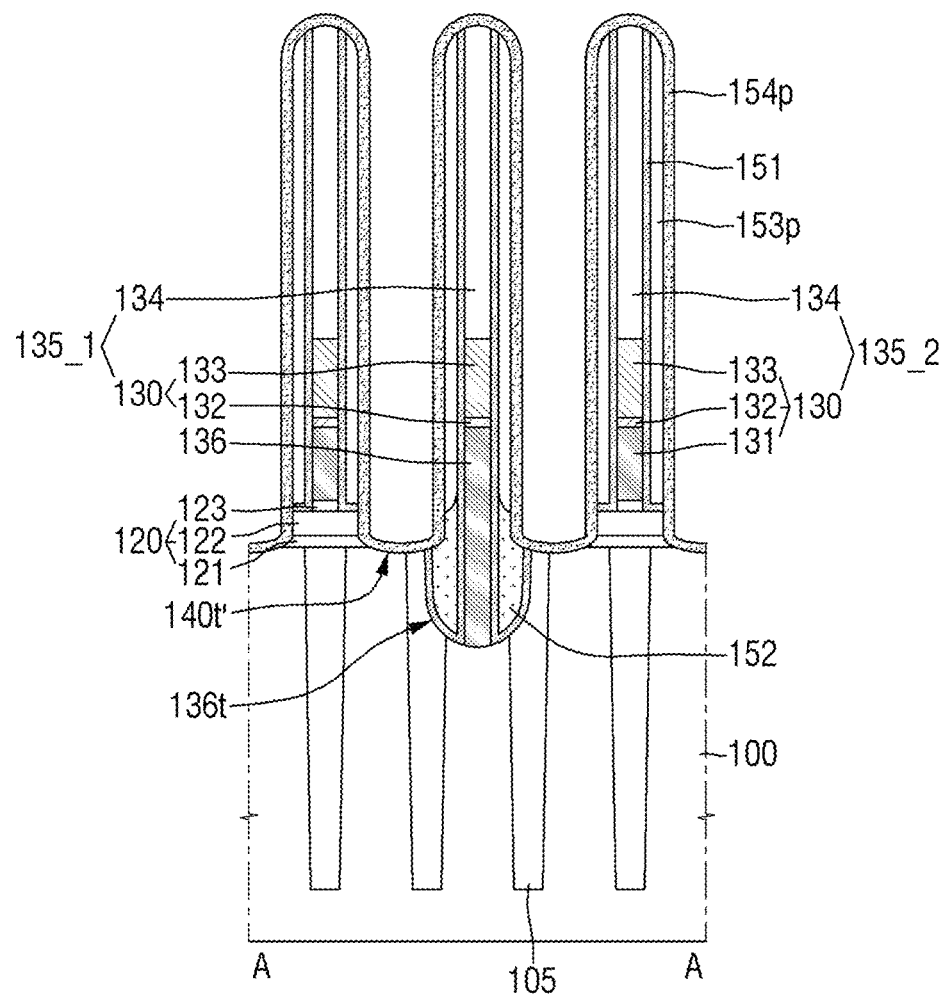

Referring to FIG. 16, a fourth pre-spacer layer 154p may be conformally formed. The fourth pre-spacer layer 154p may extend along the profile of the contact recess 140t', the side surface of the insulating pattern 120, and the side surfaces and the top surfaces of the bit line structures 135_1 and 135_1.

Figure 17:
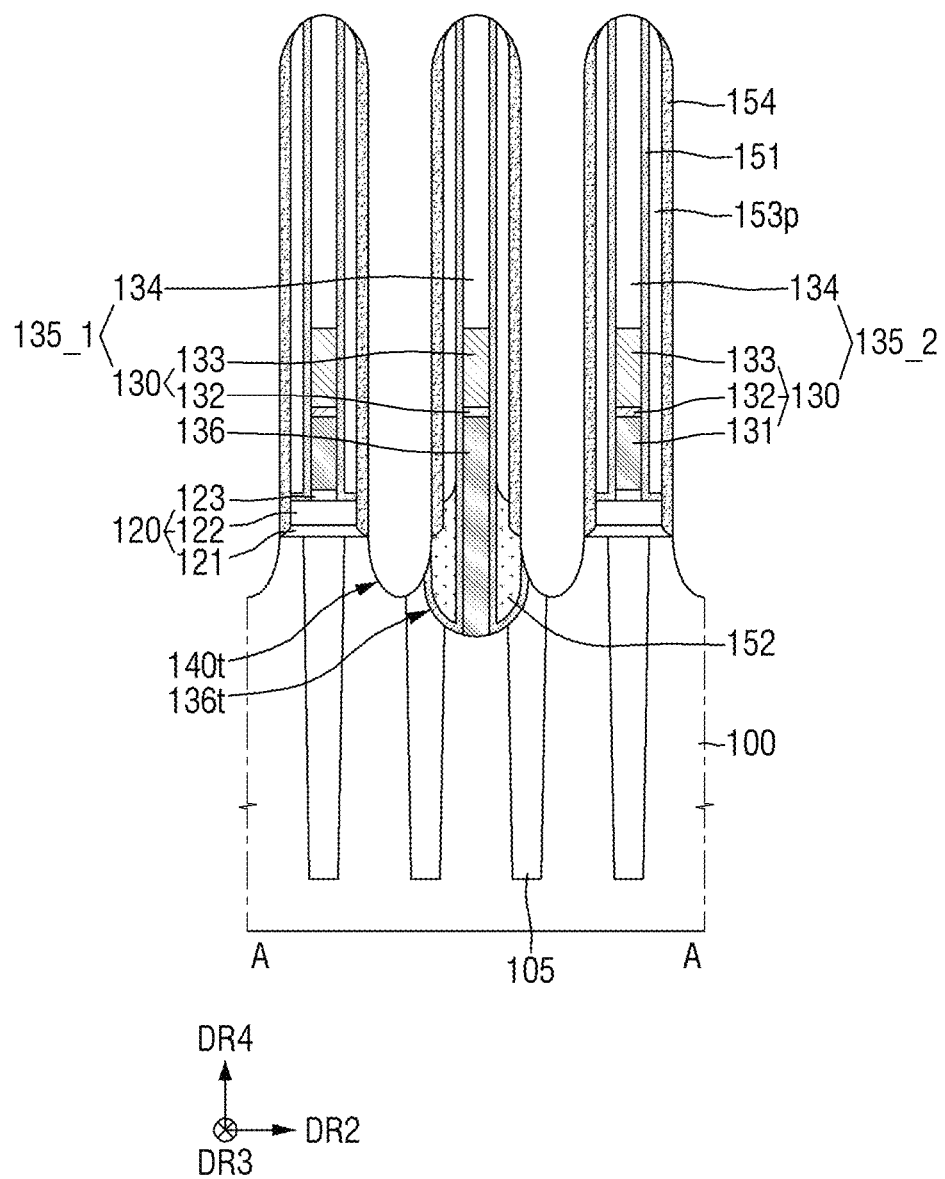

Referring to FIG. 17, the contact recess 140t may be formed between the bit line structures 135_1 and 135_2. The bottom surface of the contact recess 140t may be lower than the top surface of the substrate 100. For example, the contact recess 140t may be formed in the active region AR (see FIG. 1) of the substrate 100. In some example embodiments, the contact recess 140t may expose both ends of the active region AR.

The contact recess 140t may penetrate the fourth pre-spacer layer 154p to expose a part of the active region AR. Accordingly, the first and second spacers 151 and 152 disposed on the side surface of the first bit line structure 135_1 may be formed. In addition, in the process of forming the contact recess 140t, the fourth pre-spacer layer 154p (see FIG. 16) on the top surfaces of the bit line structures 135_1 and 135_2 may be removed. Accordingly, the fourth spacer 154 may be formed.

Figure 18:
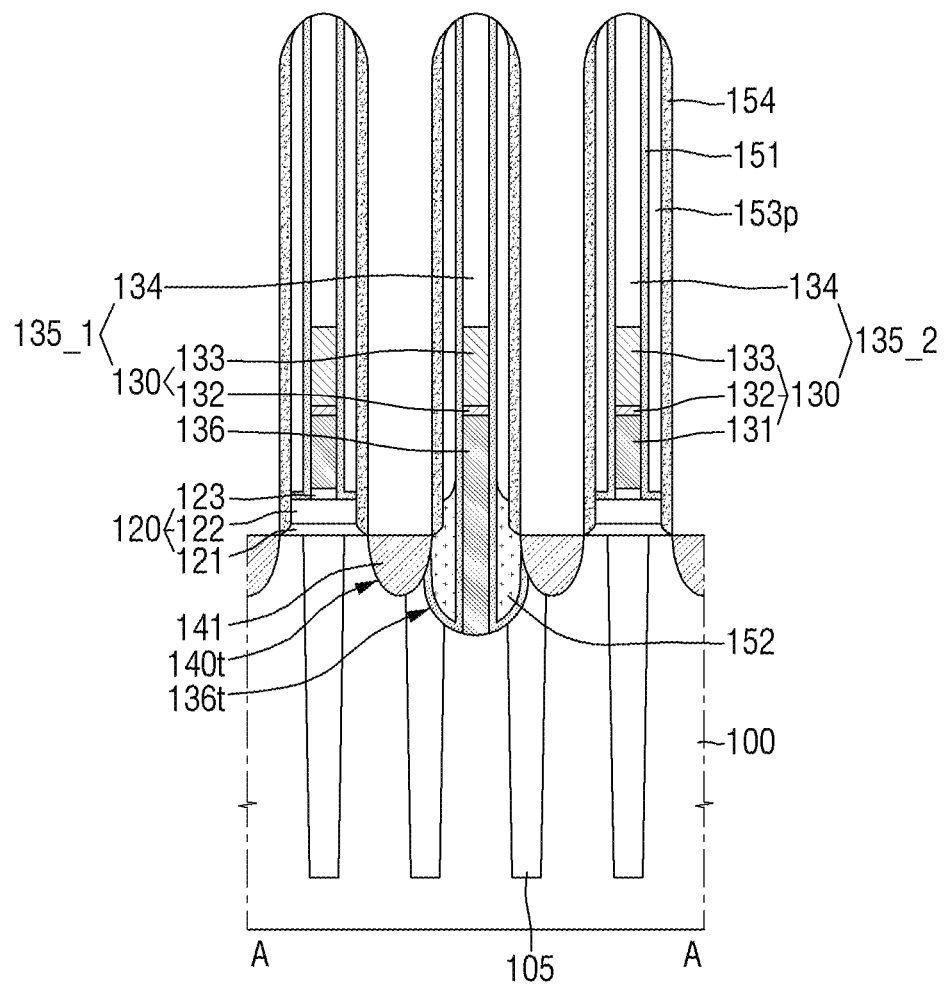

Referring to FIG. 18, the first portion 141 of the buried contact may be formed.

For example, a first pre-buried contact may be formed on the contact recess 140t. Subsequently, a planarization process such as an etch back process and/or a chemical mechanical planarization (CMP) process may be performed such that the top surface of the first pre-buried contact is disposed on substantially the same plane as the top surface of the substrate 100.

For another example, the first portion 141 of the buried contact may be an epitaxial layer grown from the substrate 100 exposed by the contact recess 140t. The first portion 141 of the buried contact may include polysilicon.

In some example embodiments, as shown in FIG. 18, the top surface of the first portion 141 of the buried contact may be disposed substantially on the same plane as the top surface of the substrate 100. Alternatively, unlike that shown in FIG. 18, the top surface of the first portion 141 of the buried contact may be higher than the top surface of the substrate 100.

Figure 19:
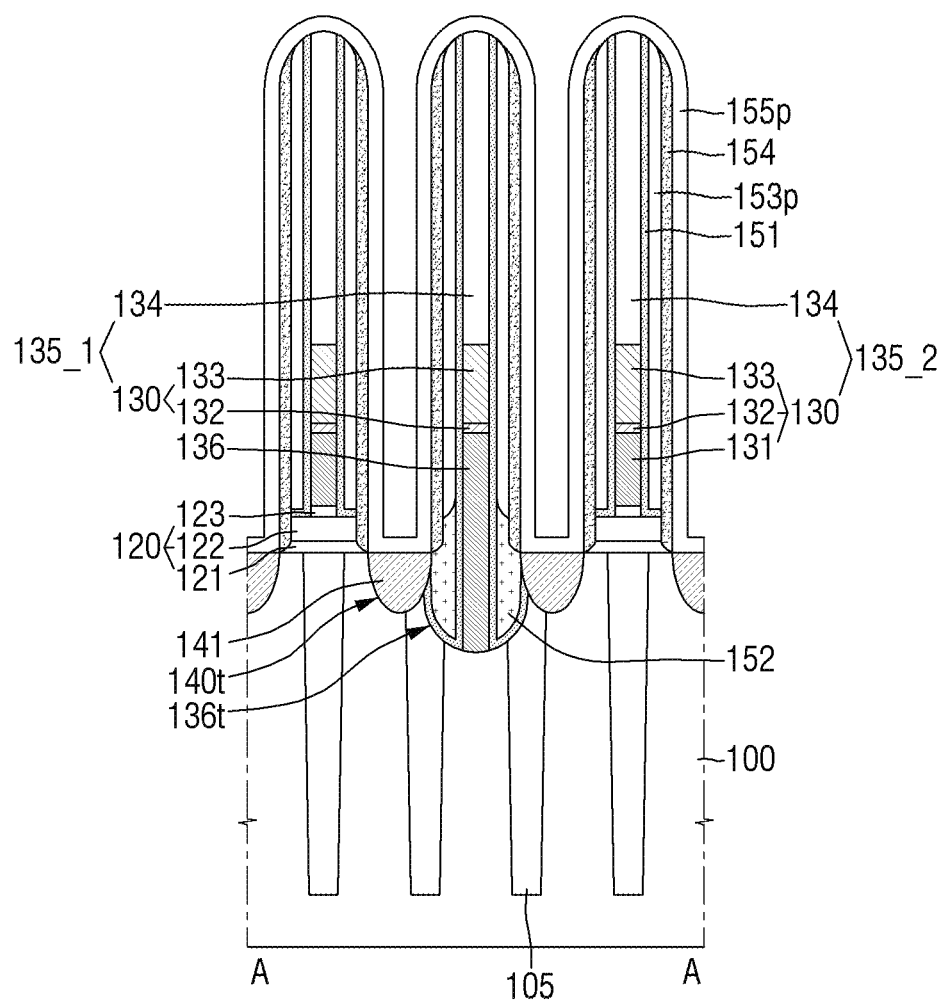

Referring to FIG. 19, a fifth pre-spacer layer 155p may be conformally formed. The fifth pre-spacer layer 155p may extend along the top surface of the first portion 141 of the buried contact, the side surface of the conductive pattern 130, the side surface and the top surface of the fourth pre-spacer layer 154p, the top surfaces of the first and third spacers 151 and 153, and the top surface of the capping pattern 134.

The fifth pre-spacer layer 155p may be formed of silicon oxide. For example, the fifth pre-spacer layer 155p may be formed by the ALD process.

Figure 20:
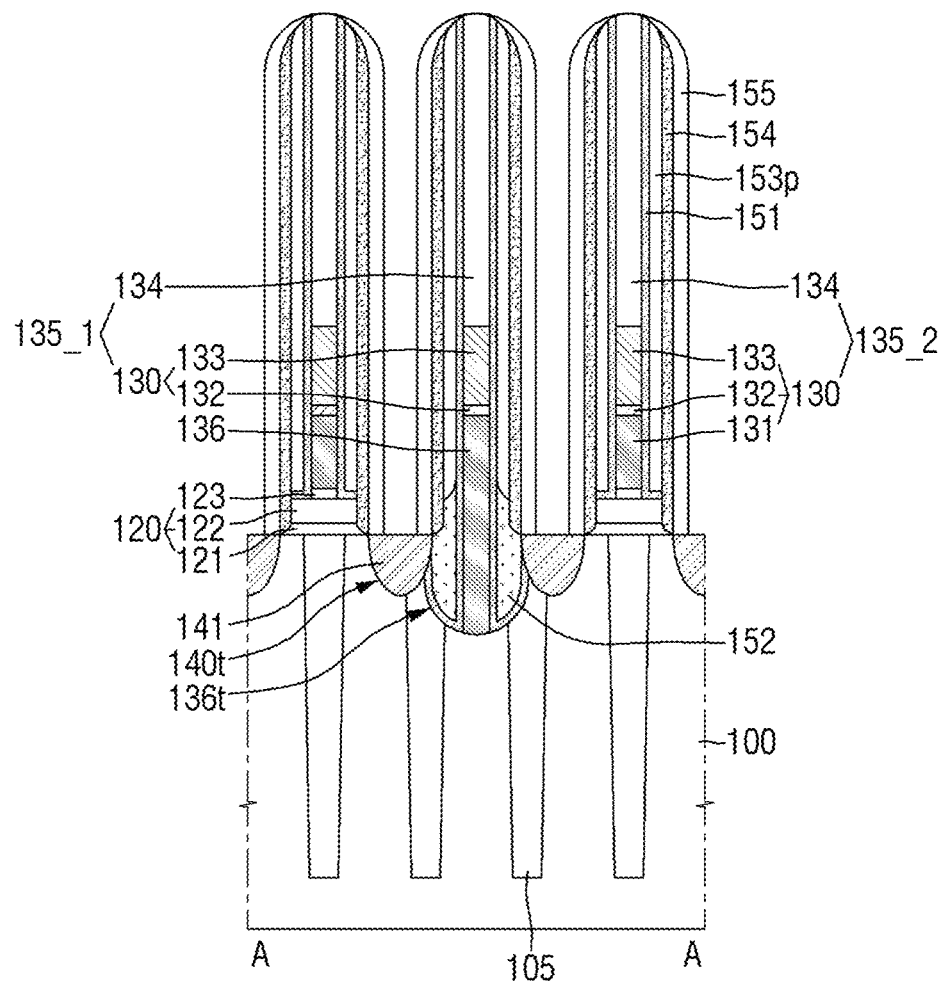

Referring to FIG. 20, a part of the fifth pre-spacer layer 155p (see FIG. 19) may be removed to form the fifth spacer 155. The fifth pre-spacer layer 155p (see FIG. 19) disposed on the top surface of the capping pattern 134, the top surfaces of the first and third spacers 151 and 153, the top surface of the fourth pre-spacer layer 154p, and the center portion of the top surface of the first portion 141 of the buried contact may be removed. Accordingly, at least a part of the top surface of the first portion 141 of the buried contact may be exposed and the fifth spacer 155 may be formed. The fifth spacer 155 may extend in the fourth direction DR4 on the top surface of the first portion 141 of the buried contact.

Figure 21:
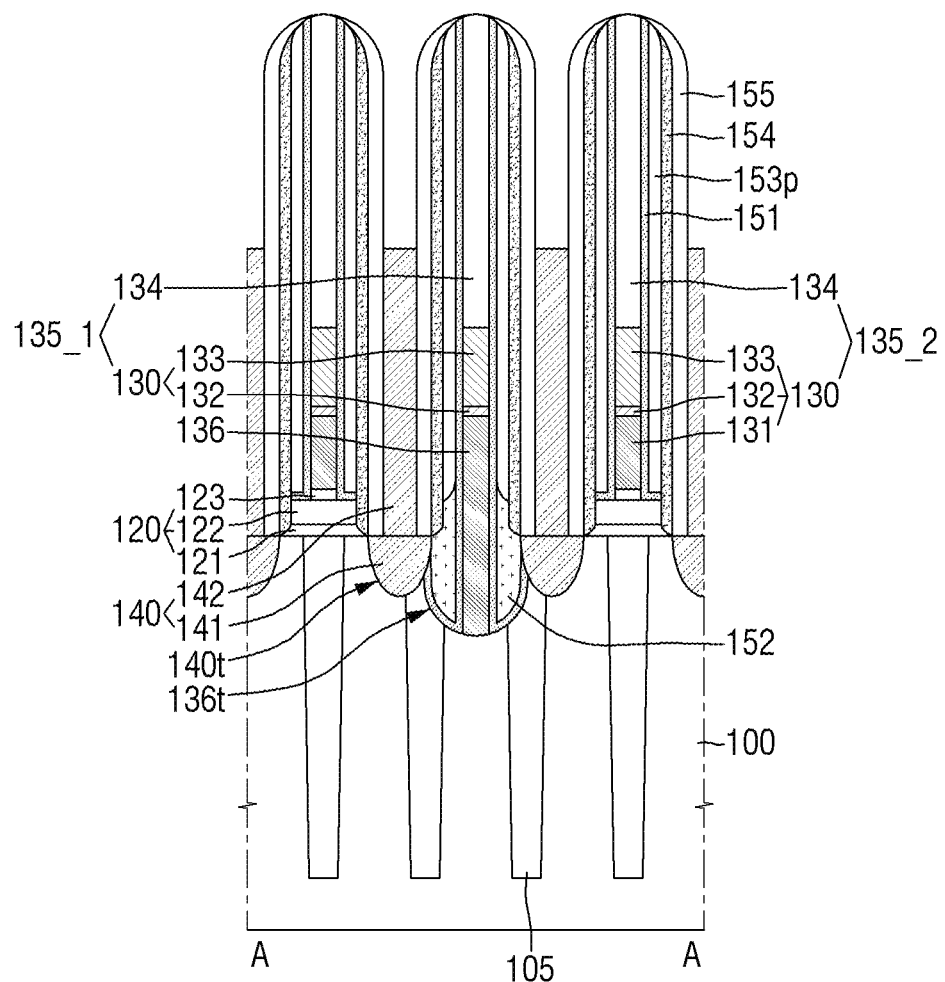

Referring to FIG. 21, the second portion 142 of the buried contact may be formed. The second portion 142 may be formed on the first portion 141 of the buried contact, between the fifth spacer 155 disposed on the side surface of the first bit line structure 135_1 and the fifth spacer 155 disposed on the side surface of the second bit line structure 135_2. Accordingly, the buried contacts 140 forming a plurality of isolated regions may be formed. The buried contact 140 may include doped or undoped polysilicon, without being limited thereto.

Figure 22:
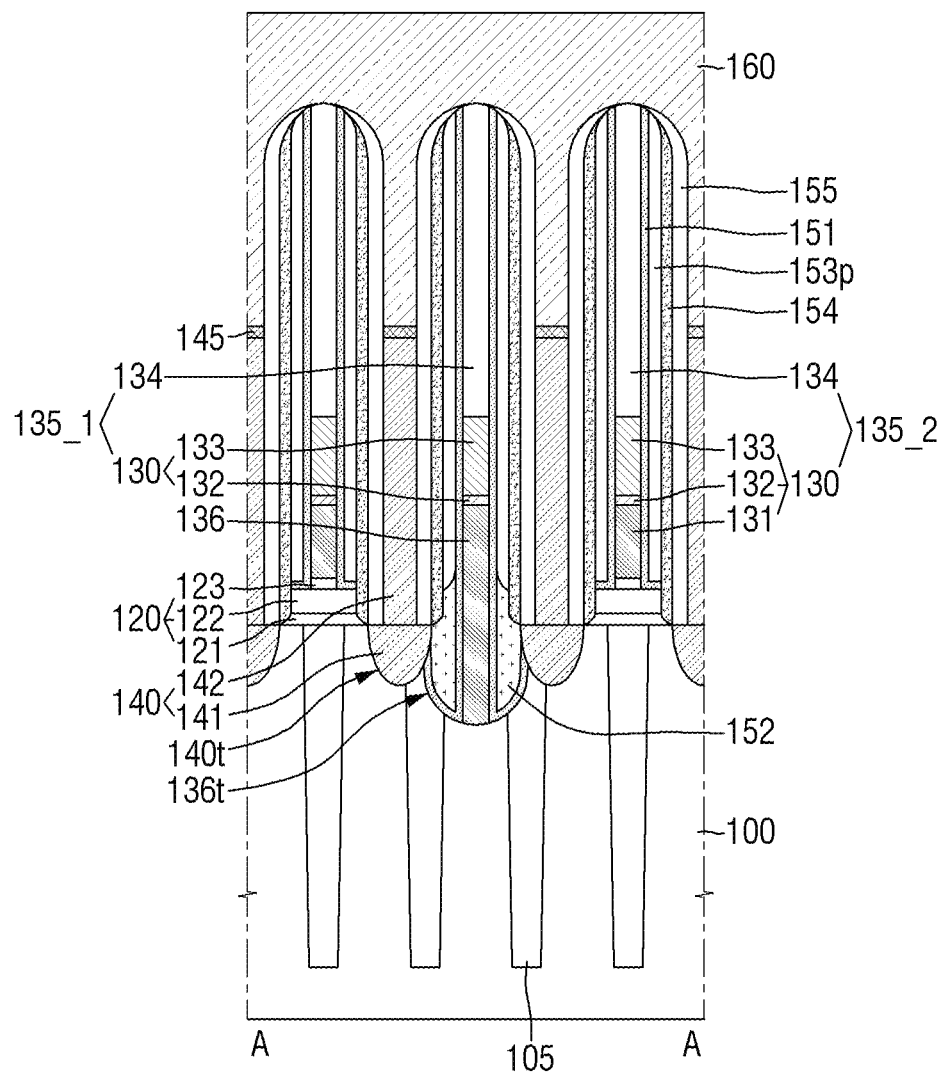

Referring to FIG. 22, the silicide layer 145 and the landing pad 160 may be sequentially stacked on the buried contact 140. In some example embodiments, the top surface of the landing pad 160 may be higher than the top surfaces of the bit line structures 135_1 and 135_2. The landing pad 160 may include, for example, tungsten (W), without being limited thereto.

Figure 23:
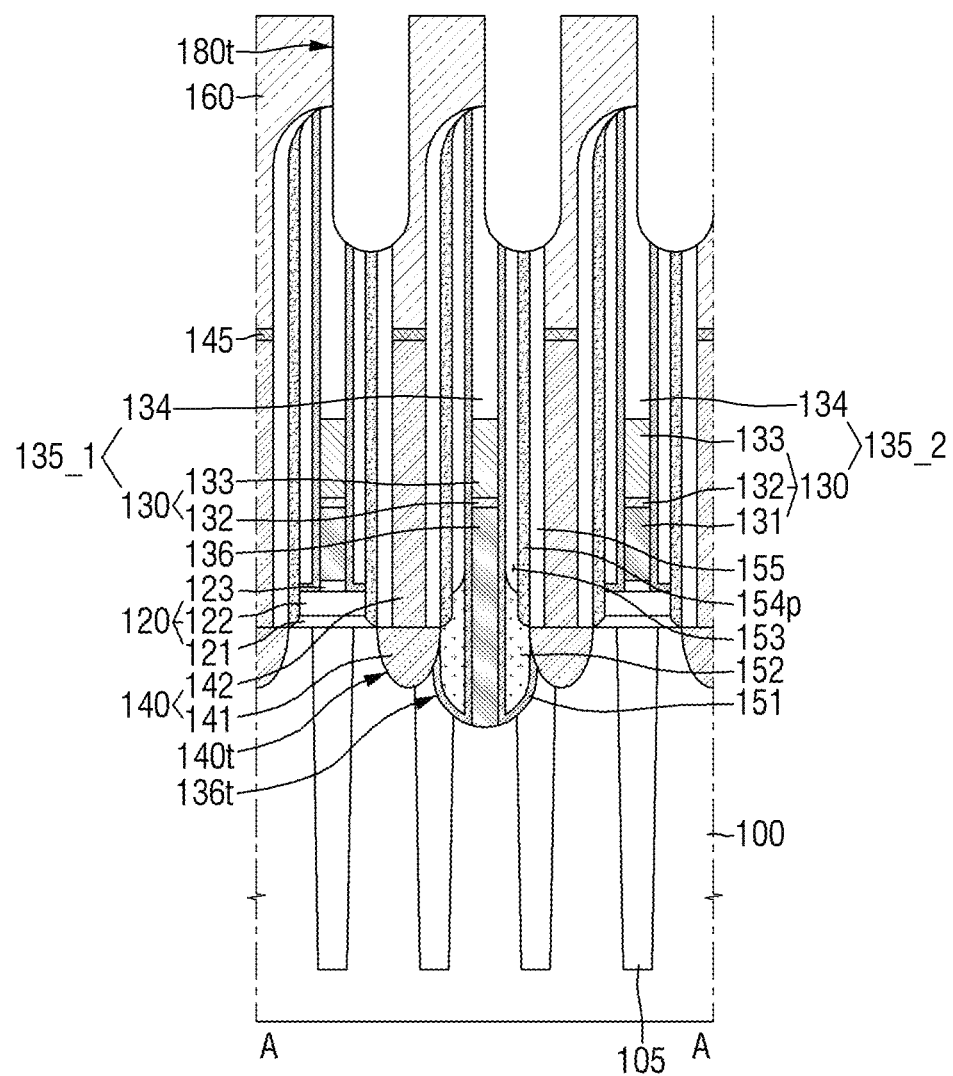
Figure 23:
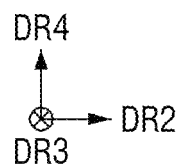

Referring to FIG. 23, the third trench 180t may be formed in the landing pad 160. In other words, the landing pad 160 may be patterned by the third trench 180t. Accordingly, the landing pads 160 forming a plurality of isolated regions may be formed. In some example embodiments, the third trench 180t may be formed such that the plurality of landing pads 160 are arranged in a honeycomb structure. Accordingly, as shown in FIG. 1, the plurality of landing pads 160 arranged in the honeycomb structure may be formed.

In some example embodiments, the third trench 180t may be formed to overlap the fourth pre-spacer layer 154p. Accordingly, the top portion of the fourth pre-spacer layer 154p may be exposed by the third trench 180t.

Figure 24:
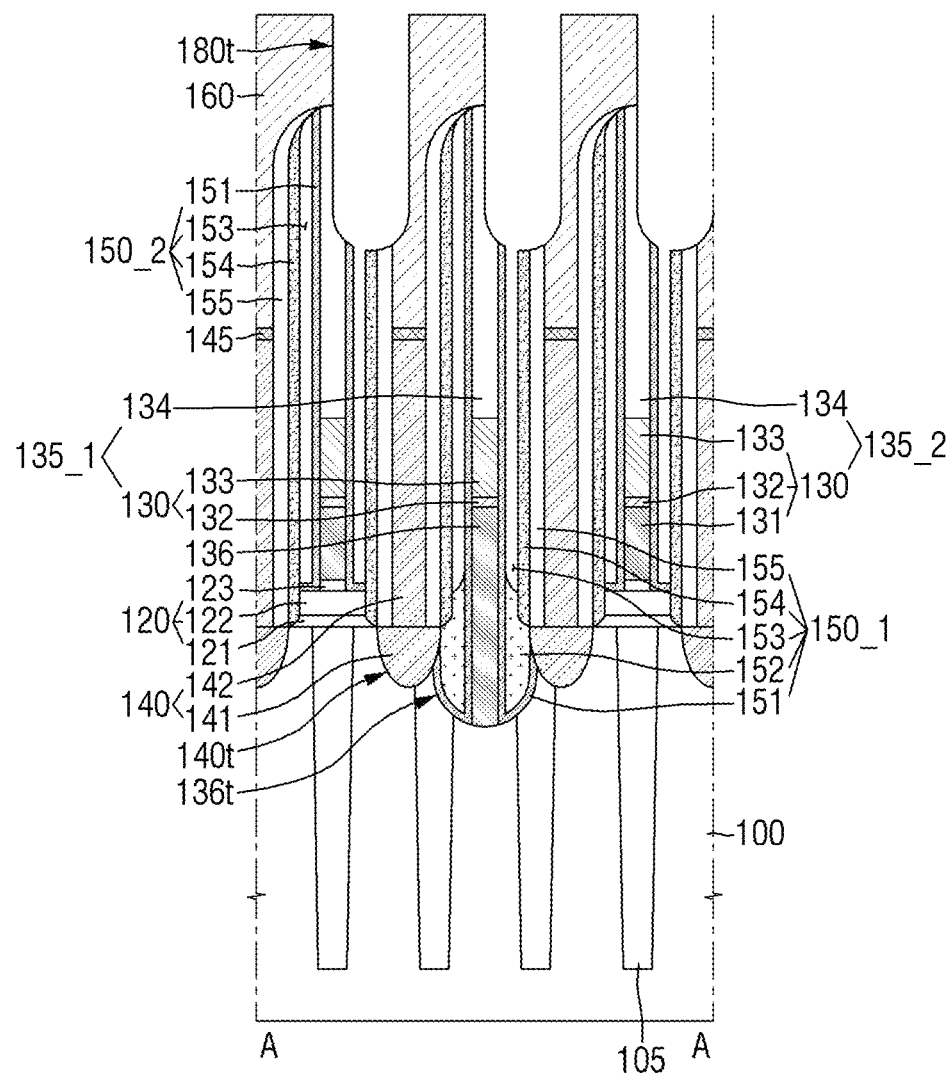

Referring to FIG. 24, the fourth spacer 154 may be formed by removing the fourth pre-spacer layer 154p (see FIG. 23).

For example, after the third trench 180t is formed, a wet etching process may be performed. The wet etching process may be performed using, e.g., hydrogen fluoride (HF) or phosphoric acid ($H_3PO_4$), but example embodiments are not limited thereto. Accordingly, the fourth pre-spacer layer 154p (see FIG. 23) exposed by the third trench 180t may be removed to form the fourth spacer 154 defined by the first to third spacers 151, 152, and 153.

Figure 25:
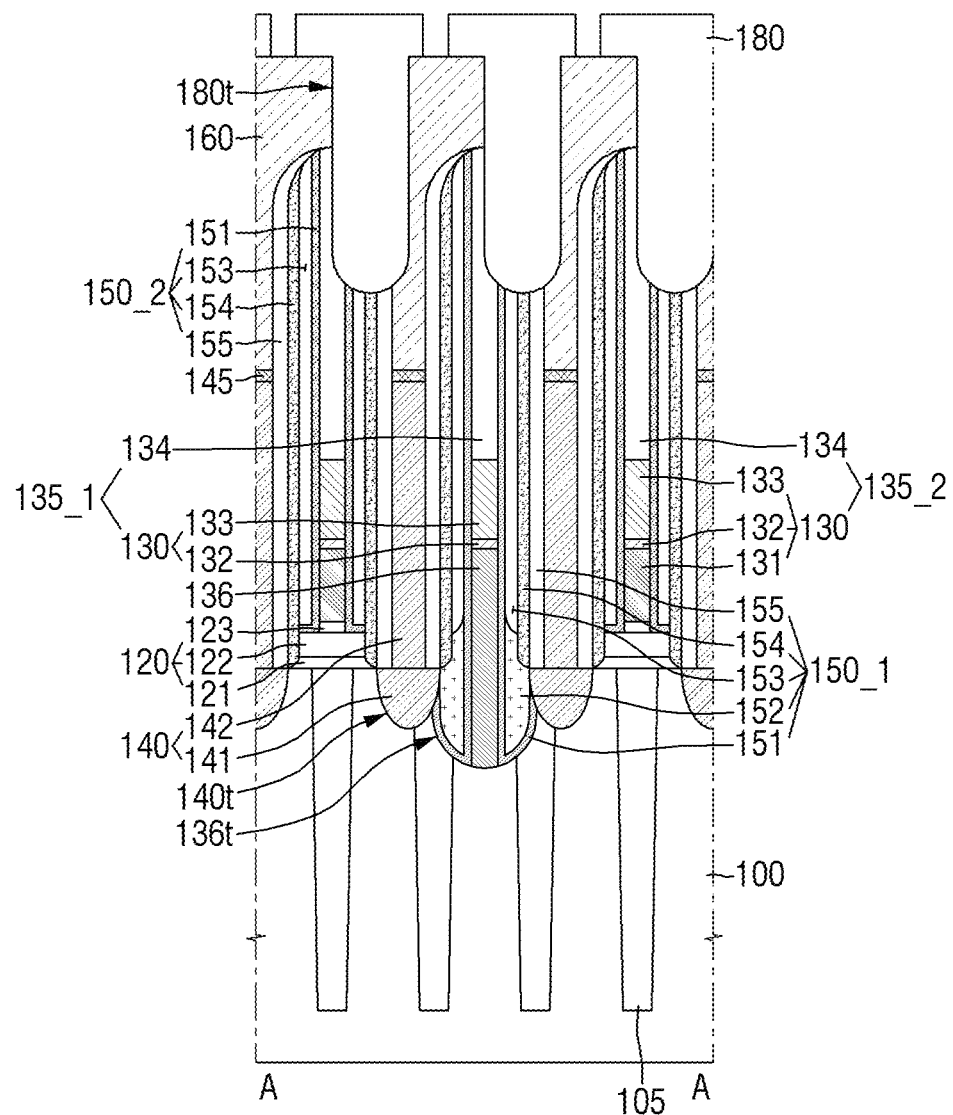

Referring to FIG. 25, the interlayer insulating layer 180 may be formed to cover the top surface of the landing pad 160 and to fill the third trench 180t. Subsequently, the interlayer insulating layer 180 may be patterned to expose a part of the top surface of the landing pad 160.

Next, referring to FIG. 2, the capacitor structure 190 may be formed on the interlayer insulating layer 180. The capacitor structure 190 may be connected to, e.g. directly connected to, the top surface of the landing pad 160 exposed on the interlayer insulating layer 180. Accordingly, a method for fabricating a semiconductor device having improved operating characteristics may be provided.

Figure 26:
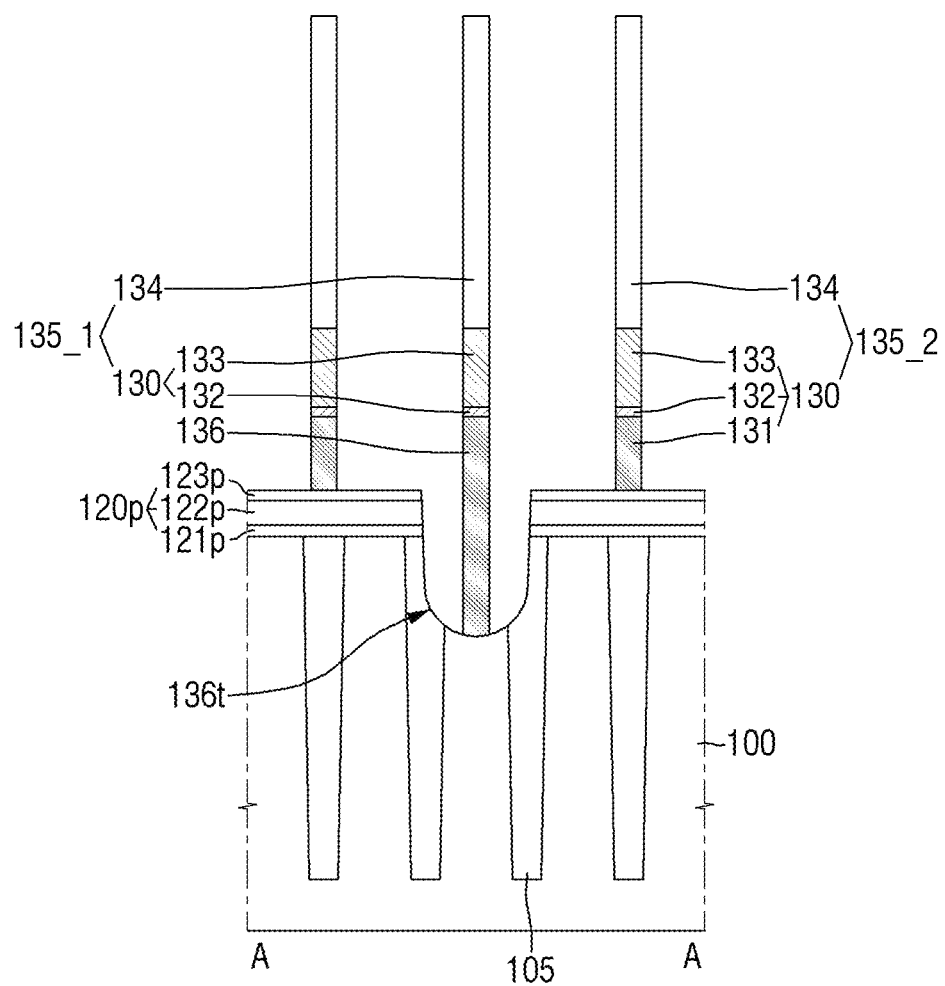
FIGS. 26 to 30 are diagrams illustrating the intermediate steps of a method for fabricating a semiconductor device according to some example embodiments.

FIGS. 26 to 30 are diagrams illustrating the intermediate steps of a method for fabricating a semiconductor device according to some example embodiments. For simplicity of description, redundant parts of the description made with reference to FIGS. 10 to 25 may be recapitulated or omitted. For reference, FIGS. 26 to 30 are cross-sectional views taken along line A-A of FIG. 1. FIG. 26 may illustrate a process performed after the step of FIG. 10.

Referring to FIG. 26, the first to third pre-conductive layers 131p, 132p, and 133p (see FIG. 10), the pre-direct contact 136p, and the pre-capping pattern 134p may be patterned. Accordingly, the direct contact 136 and the first bit line structure 135_1 having a width smaller than that of the first trench 136t may be formed, and the second bit line structure 135_2 may be formed on the pre-insulating pattern 120p.

Figure 27:
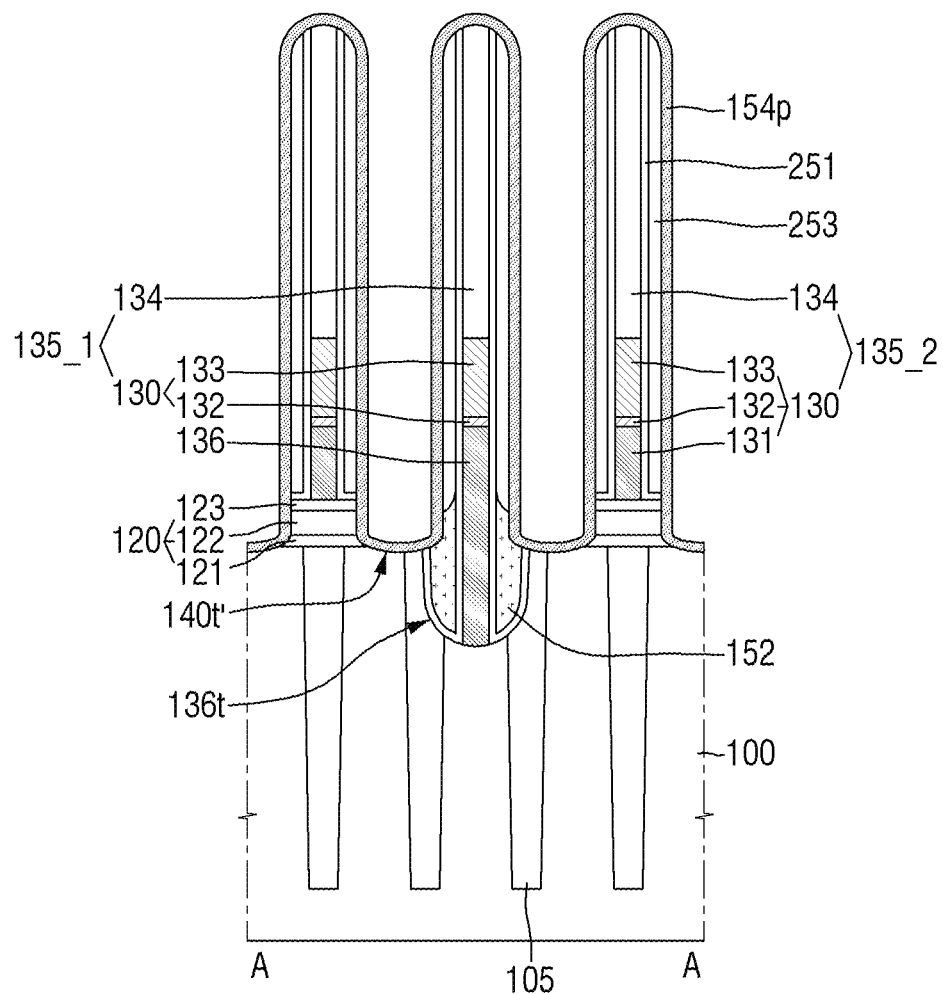

Referring to FIG. 27, as described with reference to FIGS. 12 to 15, the first spacer 251, the second spacer 152, the third spacer 253, and the pre-contact recess 140t' may be formed. For example, the first pre-spacer layer may be conformally formed on the resultant structure of FIG. 26. The second pre-spacer layer may be formed on the first pre-spacer layer to fill the first trench 136t. The second pre-spacer layer may include, e.g. may consist of, a material different from the first pre-spacer layer. The second pre-spacer layer may include, e.g. may consist of, a material having an etch selectivity with respect to the first pre-spacer layer. Subsequently, a part of the second pre-spacer layer may be removed by using the first pre-spacer layer as an etch stop layer. Accordingly, the second pre-spacer layer may fill the first trench 136t. The removal of a part of the second pre-spacer layer may be performed by a wet etching process using, e.g., phosphoric acid ($H_3PO_4$), but is not limited thereto. Subsequently, the third pre-spacer layer may be conformally formed.

Subsequently, the pre-contact recess 140t' may be formed, and accordingly, the third spacer 253 may be formed. In addition, the first spacer 251 disposed on the side surface of the second bit line structure 135_2 may be formed.

The first spacer 251 and the third spacer 253 may be made of silicon oxide, and the second spacer 152 may be made of, include, consist of, or consist essentially of silicon nitride. The second spacer 152 may not include silicon oxide.

The fourth pre-spacer layer 154p may be conformally formed, e.g. formed with a CVD process. The fourth pre-spacer layer 154p may extend along the profile of the contact recess 140t', the side surface of the insulating pattern 120, and the side surfaces and the top surfaces of the bit line structures 135_1 and 135_1.

Figure 28:
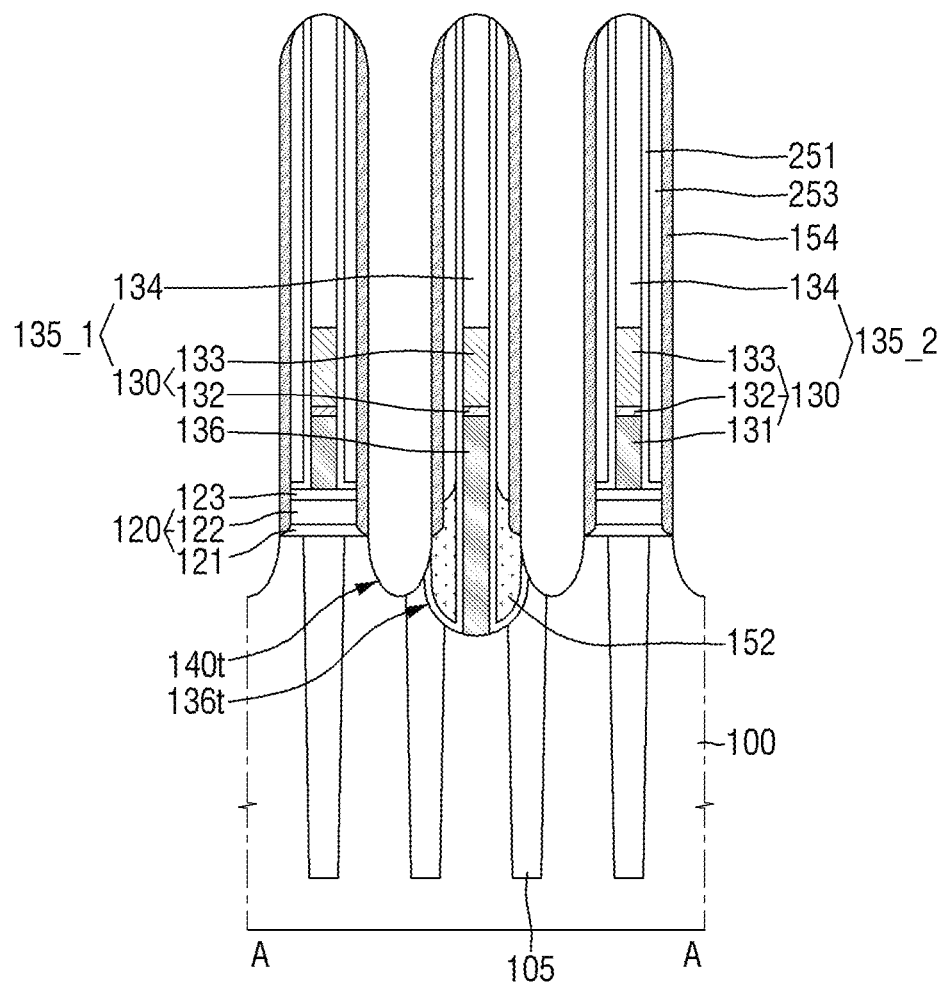

Referring to FIG. 28, the contact recess 140t may be formed between the bit line structures 135_1 and 135_2. Accordingly, the fourth spacer 154 may be formed. In addition, the first and second spacers 251 and 152 disposed on the side surface of the first bit line structure 135_1 may be formed.

Figure 29:
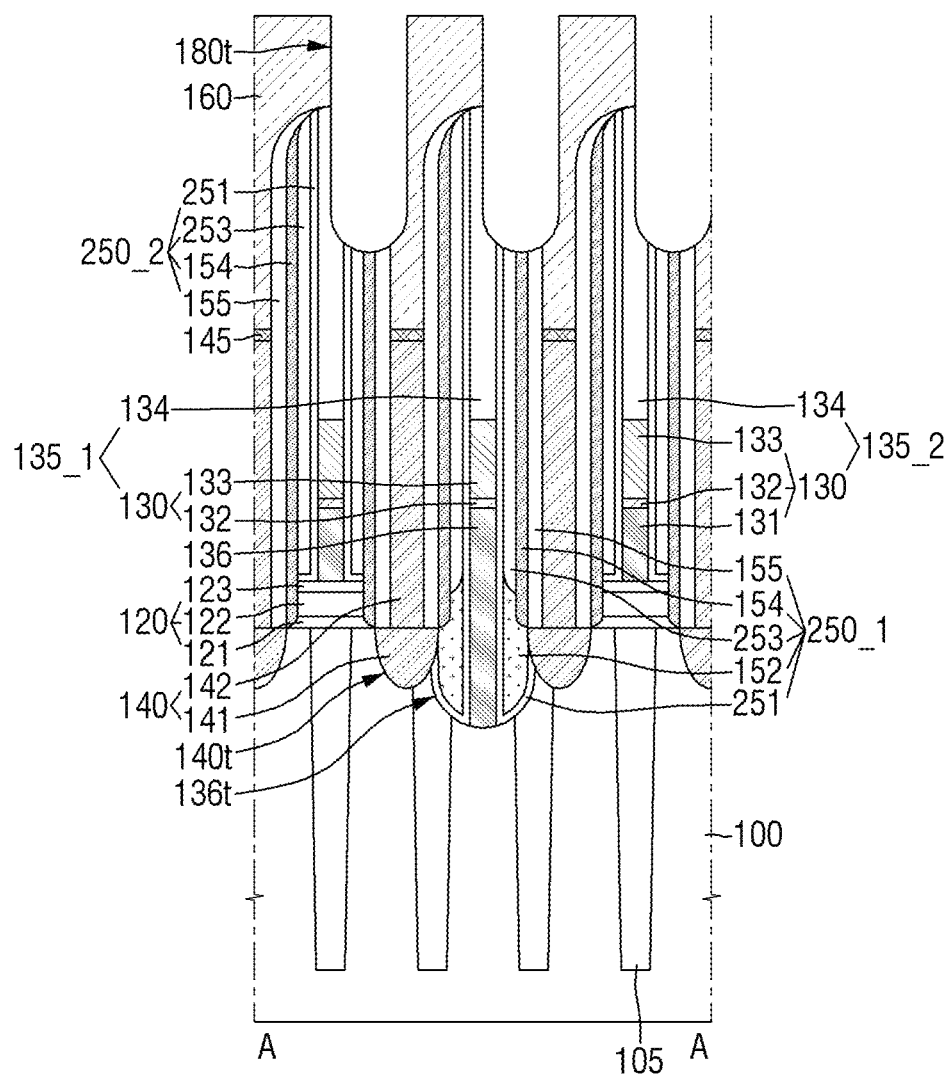

Referring to FIG. 29, as described with reference to FIGS. 17 to 22, the fifth spacer 155 made of, e.g. may include, consist of, or consist essentially of, silicon oxide may be formed to form the spacer structures 250_1 and 250_2. Subsequently, the silicide layer 145 and the landing pad 160 may be formed.

Next, the third trench 180t may be formed in the landing pad 160.

Figure 30:
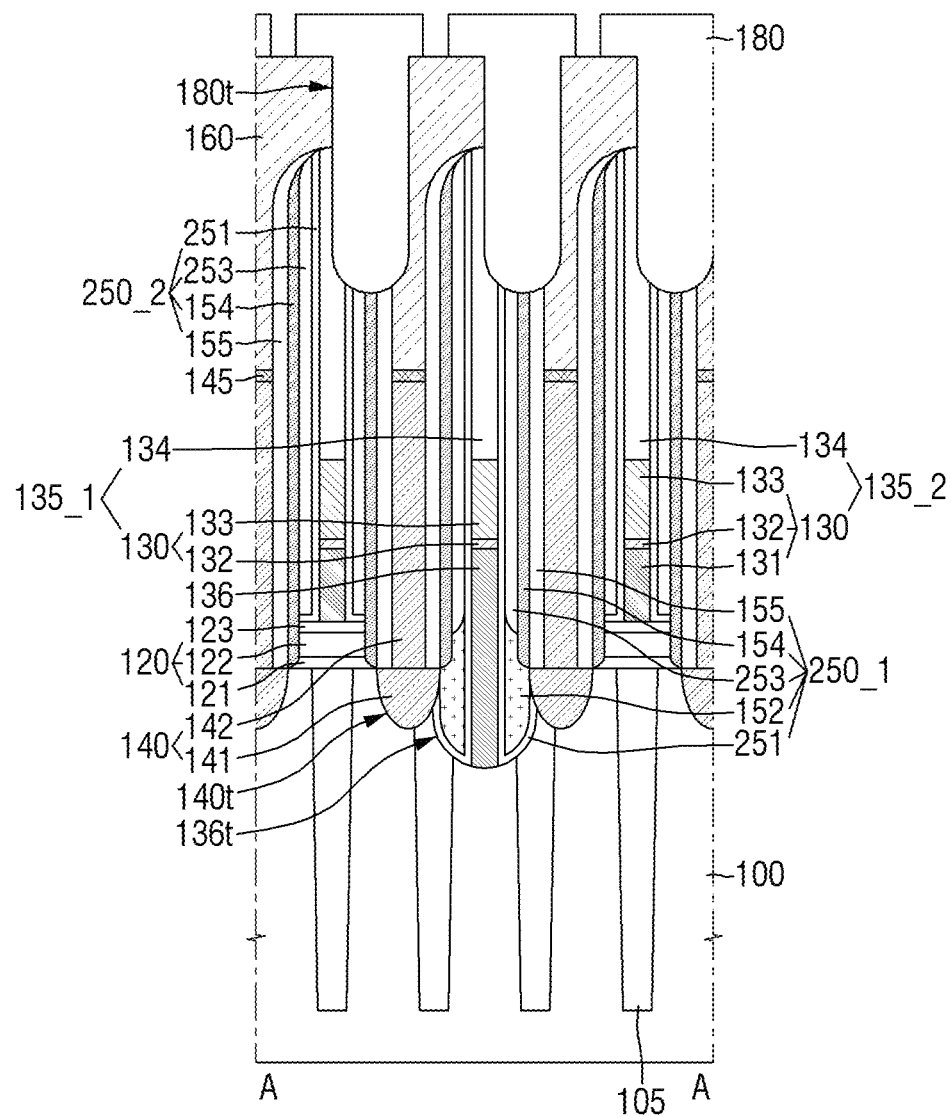

Referring to FIG. 30, the interlayer insulating layer 180 may be formed to cover the top surface of the landing pad 160 and to fill the third trench 180t. Subsequently, the interlayer insulating layer 180 may be patterned to expose a part of the top surface of the landing pad 160.

Subsequently, referring to FIG. 6, the capacitor structure 190 may be formed on the interlayer insulating layer 180. The capacitor structure 190 may be connected to or directly connected to the top surface of the landing pad 160 exposed on the interlayer insulating layer 180. Accordingly, a method for fabricating a semiconductor device having improved operating characteristics may be provided.

In concluding the detailed description, those of ordinary skill in the art will appreciate that many variations and modifications can be made to example embodiments without substantially departing from the principles of the present disclosure. Therefore, example embodiments are used in a generic and descriptive sense only and not for purposes of limitation.

What is claimed is:

1. A semiconductor device comprising:
    a substrate having a trench and a contact recess;
    a conductive pattern in the trench and having a width less than a width of the trench;
    a spacer structure on a side surface of the conductive pattern; and
    a buried contact including a first portion spaced apart from the conductive pattern by the spacer structure and filling the contact recess, and a second portion on the first portion, the second portion having a pillar shape having a width less than a width of a top surface of the first portion,
    wherein the contact recess has a curved profile,
    the spacer structure includes a first spacer at an outermost side, the first spacer on the first portion of the buried contact, extending along the second portion of the buried contact, contacting the buried contact, and contacting the top surface of the first portion, a second spacer extending on the first spacer along the first spacer, and a third spacer extending along the side surface of the conductive pattern and the trench and spaced apart from the first spacer by the second spacer, and
    the first spacer includes silicon oxide, and the second spacer includes silicon nitride.

2. The semiconductor device of claim 1, wherein a width of the first portion decreases away from a top surface of the substrate.

3. The semiconductor device of claim 1, wherein a boundary between the first portion of the buried contact and the second portion of the buried contact is positioned on a bottom surface of the first spacer.

4. The semiconductor device of claim 1, wherein the top surface of the first portion of the buried contact is lower than a bottom surface of the second spacer.

5. The semiconductor device of claim 1, wherein the top surface of the first portion of the buried contact is higher than a bottom surface of the second spacer.

6. The semiconductor device of claim 5, wherein the second spacer extends along at least a part of a side surface of the first portion of the buried contact.

7. The semiconductor device of claim 1, wherein the spacer structure further includes a fourth spacer on the third spacer, the fourth spacer filling the trench and including silicon nitride, and
    the second spacer extends along the trench on the first spacer and the fourth spacer.

8. The semiconductor device of claim 7, wherein the spacer structure further includes a fifth spacer on the fourth spacer, the fifth spacer being spaced apart from the first spacer by the second spacer,
    the third spacer includes silicon nitride, and the fifth spacer includes air.

9. The semiconductor device of claim 7, wherein the spacer structure further includes a fifth spacer on the fourth spacer, the fifth spacer being apart from the first spacer by the second spacer, and
    the third spacer and the fourth spacer include silicon oxide.

10. The semiconductor device of claim 7, wherein a bottom surface of the second spacer is lower than an uppermost surface of the fourth spacer.

11. The semiconductor device of claim 1, wherein the conductive pattern includes a bit line contact on the trench and a bit line structure on the bit line contact, and
a top surface of the bit line contact is higher than the top surface of the first portion of the buried contact.

12. The semiconductor device of claim 11, wherein a width of the bit line contact is less than a width of the bit line structure.

13. A semiconductor device comprising:
a substrate including an element isolation layer and an active region defined by the element isolation layer and arranged in a first direction;
a plurality of buried contacts connected to the active region and arranged in a second direction different from the first direction;
a plurality of bit line structures between the plurality of buried contacts that are adjacent to each other, the plurality of bit line structures extending across the active region in a third direction crossing the second direction; and
a spacer structure extending in the third direction along side surfaces of the plurality of bit line structures,
wherein each of the plurality of bit line structures includes a first bit line structure overlapping the active region and a second bit line structure overlapping the element isolation layer,
each of the buried contacts includes a first portion recessed into the element isolation layer and the active region between the first bit line structure and the second bit line structure, and a second portion on the first portion, the second portion having a pillar shape with a width less than a width of a top surface of the first portion,
a width of the first portion decreases away from a top surface of the substrate, and
the spacer structure includes a first spacer including silicon oxide and disposed at an outermost side, the first spacer extending along a side surface of the second portion and contacting the top surface of the first portion, and a second spacer including silicon nitride and extending along the first spacer on the first spacer.

14. The semiconductor device of claim 13, wherein the top surface of the first portion of the buried contact is on substantially the same plane as the top surface of the substrate.

15. The semiconductor device of claim 13, wherein the top surface of the first portion of the buried contact is higher than the top surface of the substrate.

16. The semiconductor device of claim 13, wherein the first spacer is on the first portion of the buried contact, and in the second direction, the width of the top surface of the first portion of the buried contact is substantially equal to a distance between the second spacers spaced apart from each other by the buried contact.

17. The semiconductor device of claim 13, wherein the substrate has a trench in the element isolation layer and in the active region,
the semiconductor device further comprising a bit line contact in the trench, the bit line contact having a width less than a width of the trench in the second direction,
the bit line structure is on the bit line contact and is electrically connected to the substrate through the bit line contact,
the spacer structure further includes a third spacer extending along a side surface of the bit line structure, along a side surface of the bit line contact, and along the trench, with a fourth spacer filling the trench on the third spacer, and a with fifth spacer on the fourth spacer, the fifth spacer filling a space between the second spacer and the third spacer,
the third spacer and the fourth spacer include silicon nitride, and the fifth spacer includes air.

18. The semiconductor device of claim 13, wherein the substrate further has a trench in the element isolation layer and in the active region,
the semiconductor device further comprising a bit line contact in the trench, the bit line contact having a width in the second direction less than a width of the trench,
the bit line structure is on the bit line contact and is electrically connected to the substrate through the bit line contact,
the spacer structure further includes a third spacer extending along a side surface of the bit line structure, along a side surface of the bit line contact, and along the trench, a fourth spacer filling the trench on the third spacer, and a fifth spacer on the fourth spacer, the fifth spacer filling a space between the second spacer and the third spacer,
the third spacer and the fifth spacer includes silicon oxide, and the fourth spacer includes silicon nitride.

19. A semiconductor device comprising:
a substrate having a gate trench;
a gate electrode filling a part of the gate trench and extending in a first direction;
a source/drain region on a side surface of the gate electrode;
a plurality of buried contacts including a buried contact electrically connected to the source/drain region, the plurality of buried contacts being arranged in the first direction;
a landing pad on the buried contact;
a capacitor structure on the landing pad and electrically connected to the landing pad and the buried contact;
a bit line structure extending in a second direction crossing the first direction between the plurality of buried contacts spaced apart in the first direction, the bit line structure including a conductive pattern and a capping pattern on the conductive pattern; and
a spacer structure on a side surface of the bit line structure and extending in the second direction,
wherein in cross-sectional view taken along the first direction, the buried contact includes a first portion recessed into the substrate and having an elliptical hemispherical shape convex toward the substrate, and a second portion having a pillar shape having a width smaller than a width of a top surface of the first portion, the buried contact spaced apart from the bit line structure by the spacer structure,
the spacer structure includes a first spacer in contact with the second portion of the buried contact, a second spacer extending along a side surface of the first spacer on the first spacer, and a third spacer extending along a side surface of the second spacer on the second spacer,
a boundary between the first portion of the buried contact and the second portion of the buried contact is positioned on a bottom surface of the first spacer, and
the first spacer includes silicon oxide, the second spacer includes silicon nitride, and the third spacer includes at least one of air or silicon oxide.

20. The semiconductor device of claim 19, wherein a top surface of the second spacer is higher than a top surface of the second portion of the buried contact.

* * * * *